US012777849B2

(12) United States Patent
Hoshino

(10) Patent No.: US 12,777,849 B2
(45) Date of Patent: Oct. 27, 2026

(54) POWER GENERATOR AND POWER GENERATION SYSTEM

(71) Applicant: TDK CORPORATION, Tokyo (JP)

(72) Inventor: Junichi Hoshino, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1082 days.

(21) Appl. No.: 17/802,778

(22) PCT Filed: Mar. 25, 2022

(86) PCT No.: PCT/JP2022/014400

§ 371 (c)(1),
(2) Date: Aug. 26, 2022

(87) PCT Pub. No.: WO2022/210356

PCT Pub. Date: Oct. 6, 2022

(65) Prior Publication Data

US 2024/0206340 A1 Jun. 20, 2024

(30) Foreign Application Priority Data

Mar. 31, 2021 (JP) ................................ 2021-060507
Mar. 31, 2021 (JP) ................................ 2021-060787

(51) Int. Cl.
*H01L 41/113* (2006.01)
*H10N 30/30* (2023.01)
*H10N 30/87* (2023.01)

(52) U.S. Cl.
CPC ............. *H10N 30/30* (2023.02); *H10N 30/87* (2023.02)

(58) Field of Classification Search
CPC .... H10N 30/30; H10N 30/302; H10N 30/304; H10N 30/306; H10N 30/308
(Continued)

(56) References Cited

U.S. PATENT DOCUMENTS 7,839,058 B1 * 11/2010 Churchill ............. H10N 30/304 310/332
8,653,718 B2 * 2/2014 Ide ......................... H02N 2/181 310/329
(Continued)

FOREIGN PATENT DOCUMENTS

JP 2009-247128 A 10/2009
JP 2011-233563 A 11/2011
(Continued)

OTHER PUBLICATIONS

Zhao et al.; A Shoe-Embedded Piezoelectric Energy Harvester for Wearable Sensors; Sensors; 2014; pp. 12497-12510; vol. 14, No. 7.
(Continued)

*Primary Examiner* — Derek J Rosenau
(74) *Attorney, Agent, or Firm* — Oliff PLC

(57) ABSTRACT

A power generator including a piezoelectric element that includes a piezoelectric film, and a first electrode and a second electrode sandwiching the piezoelectric film therebetween; a deformable body that has Young's modulus larger than synthetic Young's modulus of the piezoelectric element; a first fixing member that directly fixes the piezoelectric element and the deformable body; and a second fixing member that is disposed apart from the first fixing member and fixes the piezoelectric element. The deformable body is deformed with respect to stress from outside in a direction in which a distance between the first fixing member and the second fixing member is lengthened.

21 Claims, 20 Drawing Sheets

(58) Field of Classification Search
USPC .......................................................... 310/339
See application file for complete search history.

(56) References Cited

U.S. PATENT DOCUMENTS

| | | | |
|---|---|---|---|
| 2013/0002095 | A1 | 1/2013 | Van Der Linden |
| 2016/0172578 | A1 | 6/2016 | Valbin et al. |
| 2018/0108827 | A1 | 4/2018 | Hakkens et al. |

FOREIGN PATENT DOCUMENTS

| | | | |
|---|---|---|---|
| JP | 2013-522865 | A | 6/2013 |
| JP | 2016-521917 | A | 7/2016 |
| JP | 2018-516039 | A | 6/2018 |
| KR | 10-1517718 | B1 | 5/2015 |
| WO | 02/29965 | A1 | 4/2002 |

OTHER PUBLICATIONS

Translation of Jun. 24, 2025 Office Action issued in Chinese Application No. 202280002848.0.

* cited by examiner

POWER GENERATOR AND POWER GENERATION SYSTEM

TECHNICAL FIELD

The present invention relates to a power generator and a power generation system.

Priority is claimed on Japanese Patent Application No. 2021-060787 and Japanese Patent Application No. 2021-060507, filed Mar. 31, 2021, the contents of which are incorporated herein by reference.

BACKGROUND ART

Piezoelectric elements including a piezoelectric ceramic such as lead zirconate titanate (PZT) or barium titanate ($BaTiO_3$), piezoelectric elements including a piezoelectric polymer such as polyvinylidene difluoride (PVDF), and piezoelectric elements including a piezoelectric composite obtained by mixing a piezoelectric ceramic with a resin are known.

Since piezoelectric polymers and piezoelectric composites are likely to facilitate increase in surface area and have flexibility, they can also be applied to a curved surface. For this reason, application of a piezoelectric element including a piezoelectric polymer or a piezoelectric composite is expected. For example, Patent Literature 1 discloses a method for measuring a cardiac rate of a human or an animal by applying a piezoelectric element including a piezoelectric composite to a sensor.

Piezoelectric elements are expected to be applied to a power generator (for example, Patent Literature 2). When a piezoelectric element is applied to a power generator, as a piezoelectric effect exhibited by the piezoelectric element increases, an amount of power generation increases.

A piezoelectric effect increases as an amount of deformation of a piezoelectric element increases. For this reason, a method for achieving a significant piezoelectric effect and a large amount of power generation by increasing an amount of deformation of a piezoelectric element is being studied.

For example, regarding the power generator described in Patent Literature 2, a method in which one end of a piezoelectric element in a longitudinal direction is sandwiched between support bodies from above and below and a weight is attached to a free end thereof on the other side is disclosed. In the method disclosed in Patent Literature 2, it is intended that the piezoelectric element be deformed in a vertical direction.

In addition, for example, Non-Patent Literature 1 discloses an element for generating power by sandwiching a piezoelectric polymer film having electrodes respectively formed on both surfaces thereof between wave-shaped elastic bodies. In the method disclosed in Non-Patent Literature 1, it is intended that the piezoelectric polymer film having electrodes formed on both surfaces thereof be deformed in an in-plane direction due to stress applied to the wave-shaped elastic bodies.

CITATION LIST

Patent Literature

[Patent Literature 1]
Japanese Unexamined Patent Publication No. 2016-521917 (A)

[Patent Literature 2]
Japanese Unexamined Patent Publication No. 2009-247128 (A)

Non-Patent Literature

[Non-Patent Literature 1]
Jingjing Zhao, et al., "A Shoe-Embedded Piezoelectric Energy Harvester for Wearable Sensors" Sensors 2014, 14(7), 12497-12510

SUMMARY OF INVENTION

Technical Problem

However, in the methods disclosed in Patent Literature 1, Patent Literature 2, and Non-Patent Literature 1, a piezoelectric element cannot be significantly deformed in an in-plane direction. A piezoelectric element is likely to achieve better piezoelectric characteristics in a case of being deformed in the in-plane direction compared to the case of being deformed perpendicular to the in-plane direction. In addition, the method disclosed in Patent Literature 2 is a method in which an amount of power generation is maximized at a particular frequency. However, despite the complicated design using a weight, the amount of power generation in a general environment in which a frequency changes is small.

The present invention has been made in consideration of the foregoing problems, and an object thereof is to provide a power generator of which an amount of power generation can be increased by significantly deforming a piezoelectric element in an in-plane direction, and a power generation system using this.

Solution to Problem (1) A power generator according to a first aspect includes a piezoelectric element that includes a piezoelectric film, and a first electrode and a second electrode sandwiching the piezoelectric film therebetween; a deformable body that has Young's modulus larger than synthetic Young's modulus of the piezoelectric element; a first fixing member that directly fixes the piezoelectric element and the deformable body; and a second fixing member that is disposed apart from the first fixing member and fixes the piezoelectric element. The deformable body is deformed with respect to stress from outside in a direction in which a distance between the first fixing member and the second fixing member is lengthened.

(2) In the power generator according to the foregoing aspect, the second fixing member may directly fix the piezoelectric element and the deformable body. The deformable body may be disposed to overlap the piezoelectric element with the first fixing member and the second fixing member therebetween.

(2A) The power generator according to the foregoing aspect may include a piezoelectric element that includes a piezoelectric film, and a first electrode and a second electrode sandwiching the piezoelectric film therebetween; a deformable body that has Young's modulus larger than synthetic Young's modulus of the piezoelectric element; and a first fixing member and a second fixing member that are disposed on an outer surface of the piezoelectric element and fix the piezoelectric element and the deformable body. The deformable body may be disposed to overlap the piezoelectric element with the first fixing member and the second fixing member which is disposed apart from the first fixing member therebetween and may be deformed with respect to stress from outside in a direction in which a distance between the first fixing member and the second fixing member is lengthened.

(3) In the power generator according to the foregoing aspect, the first fixing member and the second fixing member may come into contact with an end portion of the piezoelectric element in a longitudinal direction.

(4) In the power generator according to the foregoing aspect, the deformable body may be disposed apart from the piezoelectric element in a first direction perpendicular to a first surface on which the piezoelectric element extends.

(5) In the power generator according to the foregoing aspect, the deformable body may have a protrusion which protrudes in a first direction perpendicular to a first surface on which the piezoelectric element extends.

(6) In the power generator according to the foregoing aspect, the piezoelectric element may have a protective layer which overlaps at least one outer surface of the first electrode and the second electrode. Young's modulus of the protective layer may be larger than Young's modulus of the piezoelectric film and smaller than a synthetic Young's modulus of the deformable body.

(7) In the power generator according to the foregoing aspect, a protective layer may be disposed on a surface of outer surfaces of the piezoelectric element on a side closer to the deformable body. The protective layer may come into contact with the first fixing member and the second fixing member and may have Young's modulus larger than Young's modulus of the piezoelectric film and smaller than synthetic Young's modulus of the deformable body.

(8) In the power generator according to the foregoing aspect, the first fixing member and the second fixing member may be adhesives having Young's modulus larger than synthetic Young's modulus of the piezoelectric element.

(9) In the power generator according to the foregoing aspect, the first fixing member and the second fixing member may be adhesives having a shearing adhesion strength of 10 MPa or higher.

(10) In the power generator according to the foregoing aspect, a piezoelectric constant of the piezoelectric film in a longitudinal direction may be larger than a piezoelectric constant thereof in a lateral direction. The first fixing member and the second fixing member may be disposed apart from each other in the longitudinal direction of the piezoelectric film.

(11) In the power generator according to the foregoing aspect, the first fixing member and the second fixing member may have a first part which is positioned between the piezoelectric element and the deformable body and a second part which overlaps the first part and covers at least a part of the deformable body.

(12) A power generation system according to another aspect of the present invention uses the power generator according to the first aspect.

(13) In the power generator according to the foregoing first aspect, the deformable body may be disposed on a first main surface side on which the piezoelectric element extends. The power generator may further include a support body that is disposed on a second main surface side of the piezoelectric element and supports the piezoelectric element. The first fixing member may be disposed on the first main surface side of the piezoelectric element. The second fixing member may be disposed on the second main surface side of the piezoelectric element and may directly fix the piezoelectric element and the support body. The power generator may further include a third fixing member that directly fixes the deformable body and the support body.

(13A) The power generator according to the foregoing aspect may include a piezoelectric element that includes a piezoelectric film, and a first electrode and a second electrode sandwiching the piezoelectric film therebetween; a deformable body that is disposed on a first main surface side on which the piezoelectric element extends and has Young's modulus larger than synthetic Young's modulus of the piezoelectric element; a support body that is disposed on a second main surface side of the piezoelectric element and supports the piezoelectric element; a first fixing member that is disposed on the first main surface side of the piezoelectric element and fixes the piezoelectric element and the deformable body; a second fixing member that is disposed on the second main surface side of the piezoelectric element and fixes the piezoelectric element and the support body; and a third fixing member that fixes the deformable body and the support body. The deformable body may be deformed with respect to stress from outside in a direction in which a distance between the first fixing member and the second fixing member is lengthened.

(14) In the power generator according to the foregoing aspect, at least any one of the first fixing member and the second fixing member may come into contact with an end portion of the piezoelectric element in a longitudinal direction.

(15) In the power generator according to the foregoing aspect, the third fixing member may be disposed on an outward side of the end portion of the piezoelectric element.

(16) In the power generator according to the foregoing aspect, the deformable body may be disposed apart from the piezoelectric element in a thickness direction perpendicular to a first main surface on which the piezoelectric element extends.

(17) In the power generator according to the foregoing aspect, the deformable body may have a protrusion which protrudes in a thickness direction perpendicular to a first main surface on which the piezoelectric element extends.

(18) In the power generator according to the foregoing aspect, the piezoelectric element may have a protective layer which overlaps at least one outer surface of the first electrode and the second electrode. Young's modulus of the protective layer may be larger than Young's modulus of the piezoelectric film and smaller than a synthetic Young's modulus of the deformable body.

(19) In the power generator according to the foregoing aspect, the protective layer may come into contact with at least any one of the first fixing member and the second fixing member.

(20) In the power generator according to the foregoing aspect, the first fixing member and the second fixing member may include an adhesive having Young's modulus larger than synthetic Young's modulus of the piezoelectric element.

(21) In the power generator according to the foregoing aspect, the first fixing member and the second fixing member may include an adhesive having a shearing adhesion strength of 10 MPa or higher.

(22) In the power generator according to the foregoing aspect, a piezoelectric constant of the piezoelectric film in a longitudinal direction may be larger than a piezoelectric constant thereof in a lateral direction. The first fixing member and the second fixing member may be disposed apart from each other in the longitudinal direction of the piezoelectric film.

(23) A power generation system according to another aspect of the present invention uses the power generator according to the first aspect. An amount of deformation of the deformable body may be within an elastic deformation region of the deformable body and the piezoelectric element.

Advantageous Effects of Invention

In a power generator and a power generation system according to the foregoing aspects, it is possible to increase an amount of power generation by significantly deforming a piezoelectric element in an in-plane direction.

DESCRIPTION OF EMBODIMENTS

Figure 1:
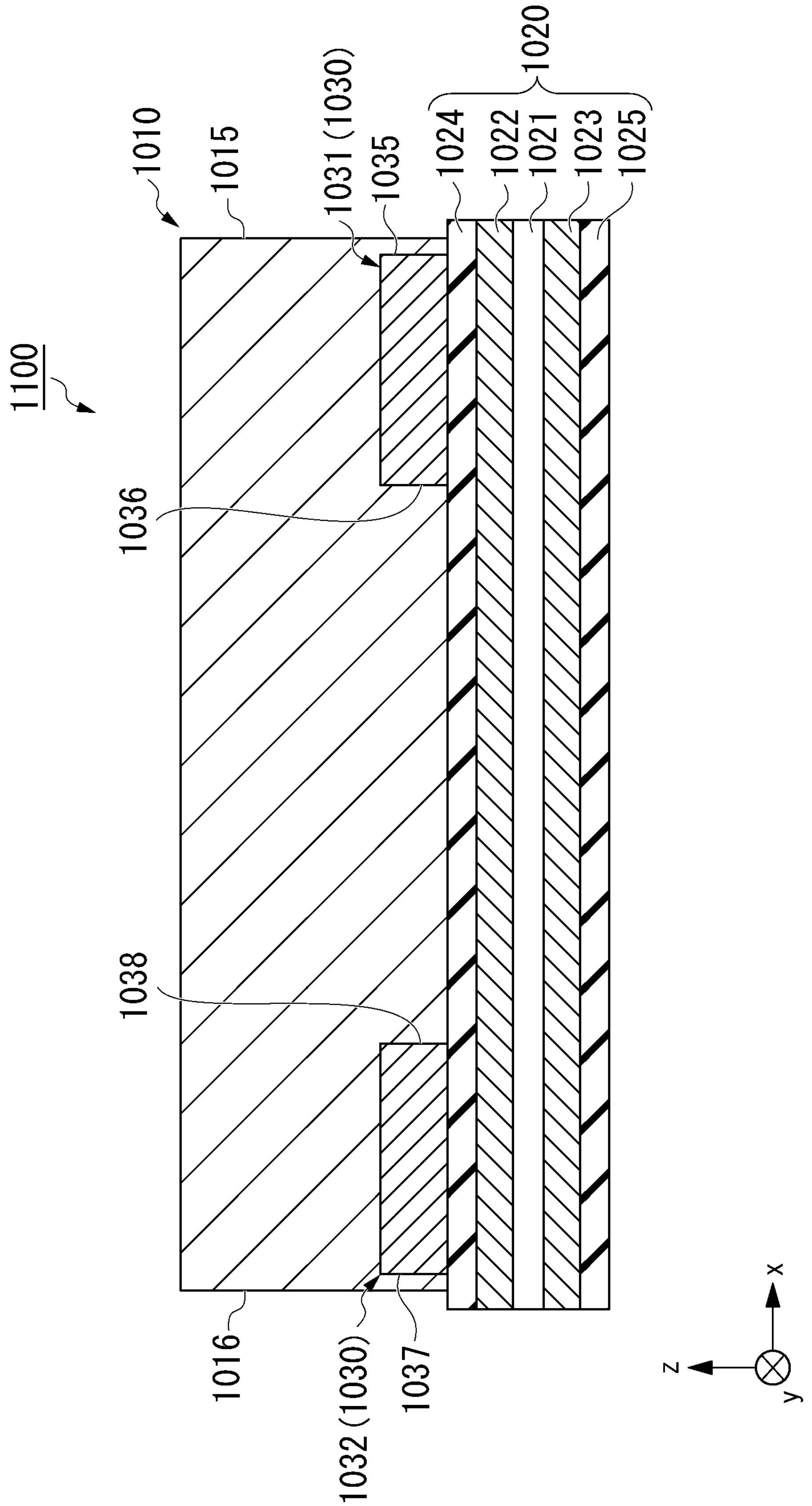
FIG. 1 is a cross-sectional view of a power generator according to a first embodiment.

Hereinafter, the present embodiment will be described in detail suitably with reference to the drawings. In the drawings used in the following description, in order to make characteristics easy to understand, characteristic portions may be illustrated in an enlarged manner for the sake of convenience, and dimensional ratios or the like of each constituent element may differ from actual values thereof. Materials, dimensions, directions, and the like exemplified in the following description are examples. The present invention is not limited thereto and can be suitably changed and performed within a range exhibiting the effects of the present invention.

First, directions will be defined. When a power generator is placed on a flat placement surface, a plane in which a piezoelectric element 1020 (refer to FIG. 1) or 2020 (refer to FIGS. 9 and 15), which will be described below, extends will be referred to as an xy plane. In an in-plane direction, a longitudinal direction of a piezoelectric film will be referred to as an x direction, and a lateral direction of the piezoelectric film will be referred to as a y direction. A z direction is a direction orthogonal to the x direction and the y direction. The z direction is an example of a lamination direction (thickness direction). Hereinafter, a positive z direction may be expressed as "upward", and a negative z direction may be expressed as "downward". The positive z direction is a direction away from the piezoelectric element 1020 or 2020. The upward and downward directions do not necessarily coincide with a direction in which gravity is applied (vertical direction).

In addition, in this specification. "extending in the x direction" denotes that a length in the x direction is longer than lengths in other directions.

First Embodiment

Figure 2:
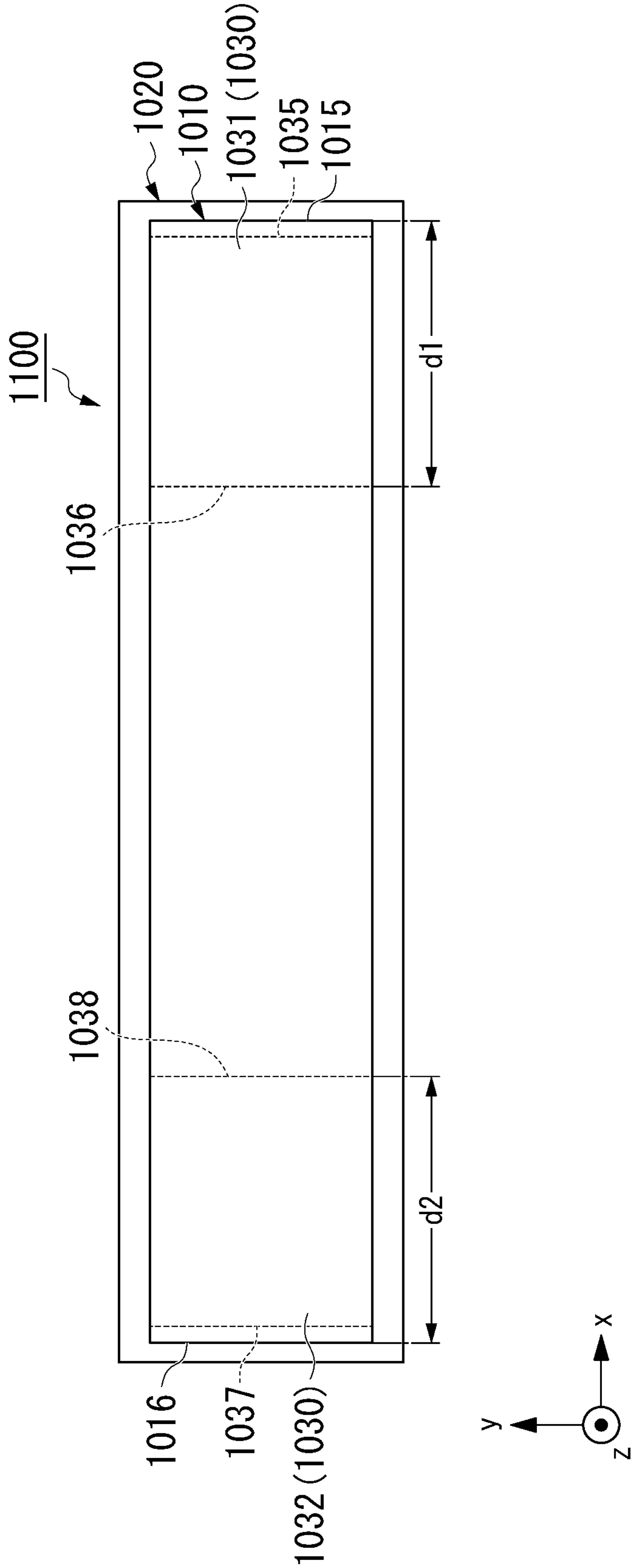
FIG. 2 is a top view of the power generator according to the first embodiment.

FIG. 1 is a cross-sectional view of a power generator 1100 according to a first embodiment, and FIG. 2 is a top view of the power generator 1100 according to the first embodiment. The power generator 1100 has a deformable body 1010, the piezoelectric element 1020, and a fixing member 1030. The fixing member 1030 has a first fixing member 1031 and a second fixing member 1032.

[Piezoelectric Element]

For example, the piezoelectric element 1020 has a piezoelectric film 1021, a first electrode 1022, a second electrode 1023, and protective layers 1024 and 1025. The first electrode 1022 and the second electrode 1023 sandwich a piezoelectric film therebetween in the lamination direction.

The piezoelectric element 1020 is a flexible piezoelectric element. For example, the piezoelectric element 1020 extends in the xy plane when it is placed on a flat placement surface.

A synthetic Young's modulus of the piezoelectric element 1020 is smaller than a Young's modulus of the deformable body 1010, which will be described below. For example, the synthetic Young's modulus of the piezoelectric element 1020 is measured under the following conditions using a tension tester ("Autograph AG-I" manufactured by Shimadzu Corporation) in conformity with JIS K 7113.

Test piece (dumbbell No. 2) thickness: 1 mm

Crosshead speed: 100 mm/min

Load cell: 100 N

Measurement temperature: 23° ° C.

The synthetic Young's modulus of the piezoelectric element 1020 of the present embodiment is approximately 1 GPa to 15 GPa, for example.

The piezoelectric element 1020 may have a constitution in which the piezoelectric film 1021, the first electrode 1022, and the second electrode 1023 are alternately laminated in the z direction.

(Piezoelectric Film)

The piezoelectric film 1021 is made of a flexible piezoelectric material. For example, the piezoelectric film 1021 includes a piezoelectric polymer or a piezoelectric composite. Examples of a piezoelectric polymer include polyvinylidene difluoride (PVDF); a polyvinylidene difluoride-based copolymer; polyvinylidene cyanide; a vinylidene cyanide copolymer; nylon such as nylon 9, nylon 11, or aramid; polylactic acid or polyhydroxycarboxylic acids such as polyhydroxybutyrate; a cellulose derivative; or polyurea.

A piezoelectric composite may be a composite obtained by dispersing a powder of a piezoelectric ceramic having particle sizes of approximately several microns or smaller into an organic polymer resin. The material and the kind of piezoelectric ceramic are not particularly limited as long as displacement applied from outside can be converted into electricity or applied electricity can be converted into displacement conversely. Examples of elements having these properties include barium titanate-based ceramic lead titanate-based ceramic, lead zirconate titanate (PZT)-based ceramic, lead niobate-based ceramic, lithium niobate single crystal, lead zirconate niobate titanate acid (PZNT) single crystal, lead magnesium niobate titanate acid (PMNT) single crystal, bismuth titanate-based ceramic, and lead metaniobate-based ceramic.

Examples of an organic polymer resin include general-purpose plastics such as polyethylene, polypropylene, polyvinyl chloride, polystyrene, polytetrafluoroethylene (PTFE), an acrylonitrile butadiene styrene resin (ABS resin), and an acrylic resin; engineering plastics such as polyamide, polycarbonate, polyethylene terephthalate (PET), and thermoplastic polyimide; synthetic rubbers such as acrylic rubber, acrylonitrile butadiene rubber, isoprene rubber, urethane rubber, butadiene rubber, and silicone rubber; a piezoelectric polymer such as polyvinylidene difluoride (PVDF) and a copolymer thereof; and a thermosetting resin such as a phenol resin, an epoxy resin, a melamine resin, and polyimide.

For example, the piezoelectric film 1021 extends in the xy plane when it is placed on a flat placement surface, has the longitudinal direction in the x direction, and has the lateral direction in the y direction. It is preferable that piezoelectric characteristics of the piezoelectric film 1021 in the x direction be superior to piezoelectric characteristics in the y direction and piezoelectric characteristics in the z direction. That is, it is preferable that a piezoelectric constant of the piezoelectric film 1021 in the x direction be larger than a piezoelectric constant in the y direction and a piezoelectric constant in the z direction.

The Young's modulus of the piezoelectric film 1021 is smaller than the Young's modulus of the protective layer, which will be described below. For example, the Young's modulus of the piezoelectric film 1021 is measured under the following conditions using a tension tester ("Autograph AG-I" manufactured by Shimadzu Corporation) in conformity with JIS K 7113.

Test piece (dumbbell No. 2) thickness: 1 mm

Crosshead speed: 100 mm/min

Load cell: 100 N

Measurement temperature: 23° ° C.

The Young's modulus of the piezoelectric film 1021 of the present embodiment is approximately 1 GPa to 10 GPa, for example.

(Electrode)

Each of the first electrode 1022 and the second electrode 1023 is disposed on one surface of main surfaces of the piezoelectric film 1021 and sandwich the piezoelectric film 1021 therebetween. Regarding an electrode material constituting the first electrode 1022 or the second electrode 1023, a metal such as aluminum, platinum, gold, silver, or copper, or a material obtained by dispersing these metals into a resin can be used. In addition, regarding a method for forming the first electrode 1022 or the second electrode 1023, a physical vapor deposition method, a printing method, or the like can be used.

At the time of power generation of the power generator 1100, electricity is induced from between first electrode and the second electrode.

(Protective Layer)

Each of the protective layers 1024 and 1025 overlaps at least one outer surface of one surface of main surfaces of the first electrode 1022 and one surface of main surfaces of the second electrode 1023 and may be disposed on both surfaces thereof. That is, any one of the protective layers 1024 and 1025 may be omitted. Surfaces, of the main surfaces of the first electrode 1022 and the second electrode 1023, on which the protective layers 1024 and 1025 can be disposed are surfaces on sides far from the piezoelectric film 1021.

Moreover, the protective layers 1024 and 1025 may cover side surfaces of the piezoelectric film 1021, the first electrode 1022, and the second electrode 1023.

The Young's modulus of the protective layers 1024 and 1025 are smaller than the Young's modulus of the deformable body 1010 (which will be described below) and larger than the Young's modulus of the piezoelectric film 1021. For example, the protective layers 1024 and 1025 can be formed by performing lamination with a thermoplastic resin film such as a PET film, performing coating of a solvent-soluble resin or a thermosetting resin through painting or dipping, performing physical vapor deposition or chemical vapor deposition of a metal, oxide, and nitride, or attaching an adhesive tape.

For example, the Young's modulus of the protective layers 1024 and 1025 are measured under the following conditions using a tension tester ("Autograph AG-I" manufactured by Shimadzu Corporation) in conformity with JIS K 7113.

Test piece (dumbbell No. 2) thickness: 1 mm

Crosshead speed: 100 mm/min

Load cell: 100 N

Measurement temperature: 23° ° C.

The thicknesses and the values of the Young's modulus of the protective layers 1024 and 1025 of the present embodiment may be suitably selected such that a necessary synthetic Young's modulus of the piezoelectric element 1020 is obtained. Stress in the thickness direction toward the piezoelectric film 1021 can be reduced and stress in the in-plane direction can be made likely to be applied to the piezoelectric film 1021 by disposing such protective layers 1024 and 1025.

"Fixing Member"

The fixing member 1030 has the first fixing member 1031 and the second fixing member 1032 and is constituted of the first fixing member 1031 and the second fixing member 1032, for example. In this specification, the first fixing member 1031 and the second fixing member 1032 may be generically referred to as the fixing member 1030. The fixing member 1030 is a material for fixing the deformable body 1010 (which will be described below) to the piezoelectric element 1020.

The first fixing member 1031 and the second fixing member 1032 are disposed on one surface of main surfaces of the piezoelectric element 1020. The first fixing member 1031 and the second fixing member 1032 are disposed such that they fit within the piezoelectric element 1020 in a plan view in the lamination direction. For example, the first fixing member 1031 and the second fixing member 1032 are disposed apart from each other in the x direction. For example, the first fixing member 1031 and the second fixing member 1032 are preferably provided at positions closer to end portions of the piezoelectric element 1020 in the longitudinal direction and preferably come into contact with the end portions of the piezoelectric element 1020 in the longitudinal direction. In this manner, it is preferable that the first fixing member 1031 and the second fixing member 1032 be disposed significantly apart from each other.

In the first fixing member 1031 and the second fixing member 1032, end portions on sides closer to the end portions of the piezoelectric element 1020 in the longitudinal direction will be generically referred to as first end portions 1035 and 1037, and an end portion of the first fixing member 1031 on a side closer to the second fixing member and an end portion of the second fixing member 1032 on a side closer to the first fixing member 1031 will be generically referred to as second end portions 1036 and 1038, respectively.

For example, the fixing member 1030 is an adhesive made of an epoxy resin, an acrylic resin, a urethane resin, a-cyanoacrylates, or the like. It is preferable that the Young's modulus of the fixing member 1030 be larger than the synthetic Young's modulus of the piezoelectric element. In addition, it is preferable that a shearing adhesion strength of the fixing member 1030 be 10 MPa or higher. Since the fixing member 1030 made of such a material is unlikely to be deformed and is unlikely to break, stress from outside is likely to be propagated to the piezoelectric element. For example, the shearing adhesion strength of the fixing member 1030 is measured in conformity with JIS K 6850. Aluminum plates (A5052P) of height 100 mm×width 25 mm×thickness 1 mm are uniformly coated with an adhesive composition, and adhesive test pieces are produced in conformity with JIS K 6850:1999. The test pieces are adhered such that an overlapping region of a base material has a size of height 12.5 mm×width 25 mm, and the thickness of an adhesive layer is adjusted to 0.25 mm using a glass bead as a spacer, thereby having the test pieces produced. In the produced adhesive test pieces, a tensile shearing strength of an adhesion portion is measured using a tension tester (brand name: TENSILON UTA-500, manufactured by ORIENTEC CO., LTD.). Measurement is performed in conformity with a tensile shearing adhesion strength test method for adhesive-rigid adhesion target material in JIS K 6850:1999. In addition, regarding measurement conditions, a distance between chucks is set to 115 mm, and a test speed is set to 10 mm/min.

"Deformable Body"

The deformable body 1010 is fixed to the piezoelectric element 1020 with two fixing members 1030 therebetween. For example, in a plan view in the lamination direction, the deformable body 1010 overlaps the piezoelectric element 1020 and overlaps at least a part of the first fixing member 1031 and the second fixing member 1032.

When the deformable body 1010 and the first fixing member 1031 partially overlap each other, it is preferable that the overlapping part be a part of the first fixing member 1031 on a side closer to the second fixing member 1032. Similarly, when the deformable body 1010 and the second fixing member 1032 partially overlap each other, it is preferable that the overlapping part be a part of the second fixing member 1032 on a side closer to the first fixing member 1031. The deformable body 1010 covers, for example, the first fixing member 1031 and the second fixing member 1032 and fills, for example, a space between the second end portions 1036 and 1038 of the first fixing member 1031 and the second fixing member 1032. For example, the deformable body 1010 comes into contact with a part on the main surface of the piezoelectric element 1020 not overlapping the fixing member 1030.

For example, the deformable body 1010 extends in the xy plane. For example, in the deformable body 1010, a shape in a plan view in the z direction is a rectangular shape, and the length in the x direction is longer than the length in the y direction. An end portion of the deformable body 1010 in the positive x direction will be generically referred to as a first end portion 1015, and an end portion thereof in the negative x direction will be generically referred to as a second end portion 1016. For example, the deformable body 1010 is disposed such that it fits inside the piezoelectric element 1020 in a plan view in the z direction.

The size of the deformable body 1010 in the y direction may be larger than the size of the piezoelectric element 1020 in the y direction.

Regarding the deformable body 1010, a material having Young's modulus larger than the synthetic Young's modulus of the piezoelectric element 1020 can be used. For example, the deformable body 1010 is made of an iron-based alloy such as carbon steel or stainless steel; a copper-based alloy such as brass, phosphor bronze, nickel silver, or beryllium copper; a metal such as a titanium alloy or a nickel alloy such as Inconel; a resin such as rubbers, polyacetal, polycarbonate, polyamide, or polyurea; or a resin such fiber reinforced plastic (FRP), glass-fiber reinforced plastic (GFRP), or carbon-fiber reinforced plastic (CFRP) obtained by reinforcing a resin with glass fibers, carbon fibers or the like.

For example, the Young's modulus of the deformable body 1010 is measured under the following conditions using a tension tester ("Autograph AG-I" manufactured by Shimadzu Corporation) in conformity with JIS K 7113.

·Test piece (dumbbell No. 2) thickness: 1 mm
Crosshead speed: 100 mm/min
Load cell: 100 N
Measurement temperature: 23° ° C.

For example, a distance d1 from the first end portion 1015 of the deformable body 1010 to the second end portion 1036 of the first fixing member 1031 is 0.01 times to 0.3 times the size of the piezoelectric element 1020 in the x direction and is more preferably 0.02 times to 0.15 times. For example, a distance d2 from the second end portion 1016 of the deformable body 1010 to the second end portion 1038 of the second fixing member 1032 can become the same length as the distance d1 from the first end portion 1015 of the deformable body 1010 to the second end portion 1036 of the first fixing member 1031.

When stress is applied from outside, the deformable body 1010 is deformed in a direction in which the distance between the first fixing member 1031 and the second fixing member 1032 is lengthened. At this time, the first fixing member 1031 and the second fixing member 1032 propagates stress applied from the deformable body 1010 to the piezoelectric element 1020. The direction of stress propagated to the piezoelectric element 1020 by the deformable body 1010 via the first fixing member 1031 in the x direction and the direction of stress propagated to the piezoelectric element 1020 by the deformable body 1010 via the second fixing member 1032 in the x direction are opposite to each other, for example.

In the power generator 1100 according to the present embodiment, stress received by the deformable body 1010 from outside is applied to the piezoelectric element 1020 via the first fixing member 1031 and the second fixing member 1032 so that the piezoelectric element 1020 can be significantly deformed in the in-plane direction. Therefore, in the power generator 1100 according to the present embodiment, a large amount of power generation can be obtained.

The power generator 1100 according to the present embodiment can also be utilized as a stress sensor using the amount of obtained power generation as an output.

Modification Example 1

Figure 3:
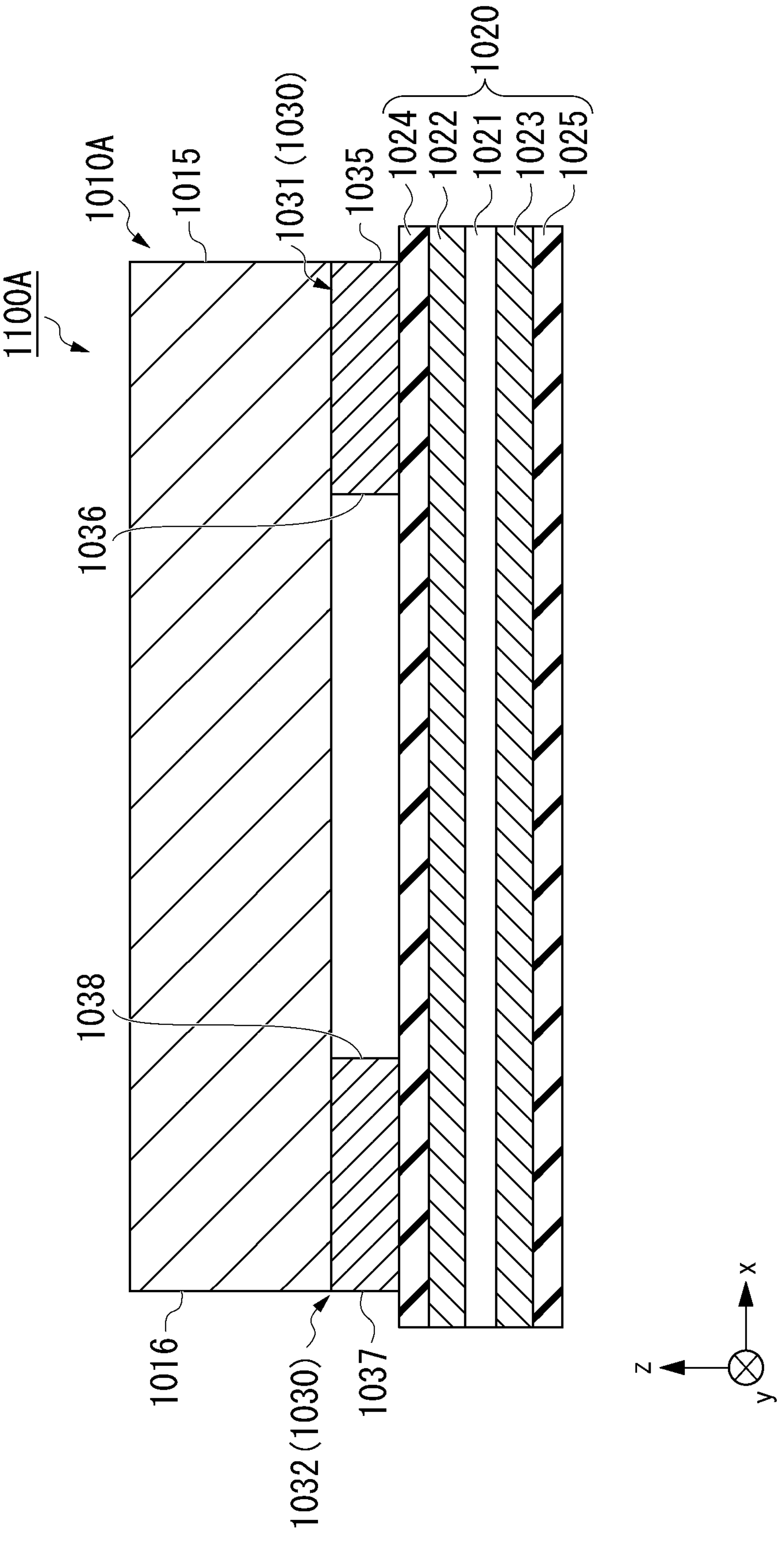
FIG. 3 is a cross-sectional view of a power generator according to a modification example 1.

FIG. 3 is a cross-sectional view of a power generator 1100A according to a modification example 1. In the power generator 1100A according to the modification example 1, the shape and disposition of a deformable body 1010A differ from those of the power generator 1100 according to the first embodiment. In the modification example 1, the same reference signs are applied to the same constituents as the first embodiment, and description thereof will be omitted.

The deformable body 1010A is disposed apart from the piezoelectric element 1020 in the z direction. The distance between the deformable body 1010A and the piezoelectric element 1020 in the z direction is the same as the thickness of the fixing member 1030, for example.

It is also possible for the power generator 1100A according to the modification example 1 to achieve effects similar to those of the power generator 1100 according to the first embodiment. In addition, in the power generator 1100A according to the modification example 1, since the deformable body 1010A and the piezoelectric element 1020 are apart from each other, frictional heat is not generated between the deformable body 1010A and the piezoelectric element 1020. For this reason, conversion of stress propagated to the piezoelectric element 1020 into frictional heat can be curbed. Therefore, in the power generator 1100A according to the modification example 1, the piezoelectric element 1020 is likely to be more significantly deformed.

Modification Example 2

Figure 4:
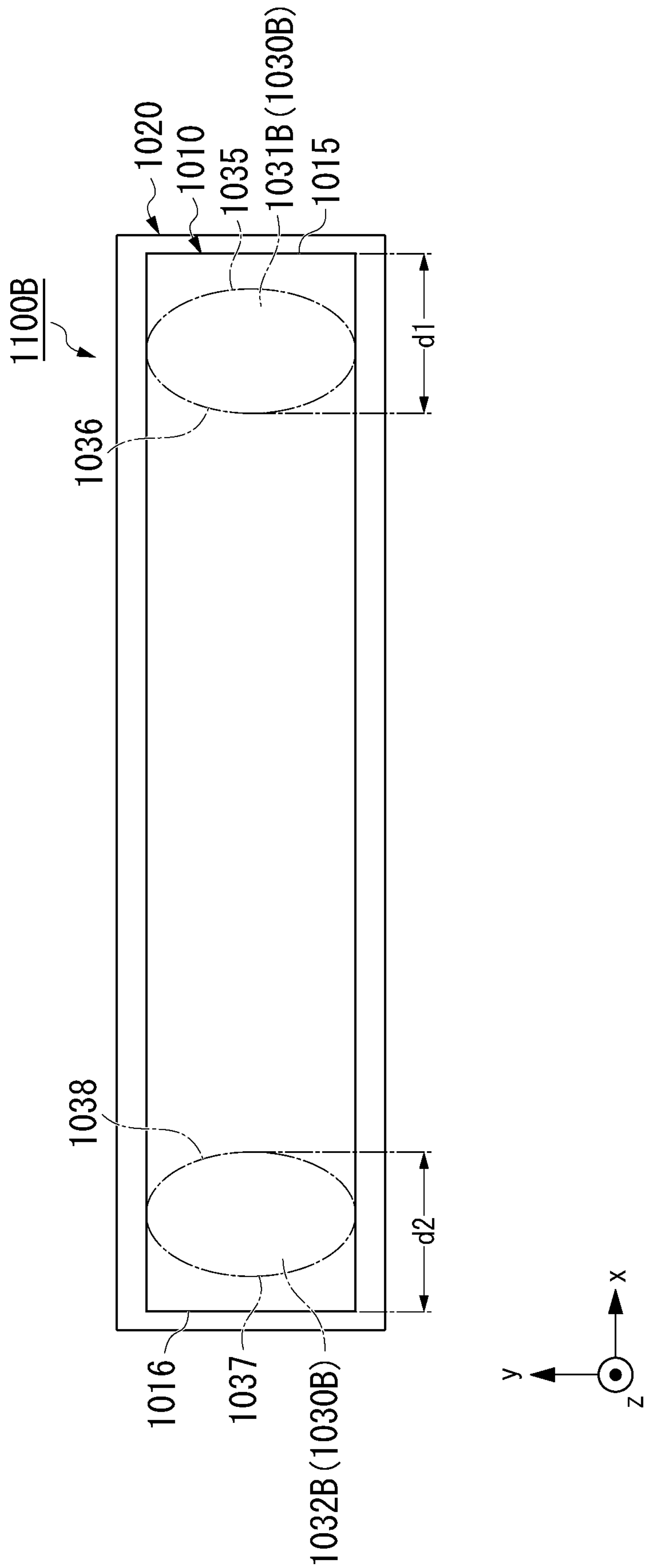
FIG. 4 is a top view of a power generator according to a modification example 2.

FIG. 4 is a top view of the power generator 1100B according to a modification example 2. The power generator 1100B according to the modification example 2 differs from the power generator according to the first embodiment in shape of a fixing member 1030B. In the modification example 2, the same reference signs are applied to the same constituents as the first embodiment, and description thereof will be omitted.

The shape of the fixing member 1030B in a plan view in the lamination direction may be a shape other than a rectangular shape. The shape of the fixing member 1030B in a plan view in the lamination direction may be an elliptical shape or a trapezoidal shape, for example. It is also possible for the power generator 1100B according to the modification example 2 to achieve effects similar to those of the power generator 1100 according to the first embodiment.

"Method for Manufacturing Power Generator"

Next, an example of a method for manufacturing a power generator will be described. The method for manufacturing a power generator according to the present embodiment includes a step of preparing a piezoelectric element, a step of disposing a fixing member on an outer surface of a piezoelectric element, and a step of disposing a deformable body.

In the step of preparing a piezoelectric element, a piezoelectric material, an electrode, and a protective layer are formed in a predetermined lamination order.

A piezoelectric material layer is subjected to poling processing or the like such that desired piezoelectric characteristics are manifested. A piezoelectric material layer which is molded into a film may be used, or a base material in which an electrode is formed on a protective layer may be coated with a piezoelectric material which has dissolved in a solution. An electrode is formed by forming aluminum, platinum, gold, silver, or the like by a physical vapor deposition method or performing drying or sintering after coating of a paste obtained by dispersing silver or copper powder in a resin and a solution.

For example, the protective layer can be formed by performing lamination with a thermoplastic resin film such as a PET film from both surfaces of a piezoelectric material layer in which electrodes are respectively formed on both surfaces, or performing coating of a resin which has dissolved in a solution through coating, dipping, or the like. The protective layer may be constituted of a plurality of layers.

In addition, a plurality of layers may be laminated in each of these layers such that a piezoelectric material layer is electrically connected thereto in series or in parallel.

For example, the fixing member is formed by pasting a predetermined adhesive at two locations on a main surface of a piezoelectric element. A fixing tool such as a screw or a clamp, an adhesive tape, or the like may be used.

In the step of disposing a deformable body, when a metal is used as a deformable body, first, a metal is subjected to working into a predetermined shape through punching, debossing, or the like. At this time, a location overlapping the fixing member when a piezoelectric element is caused to overlap may be recessed. Next, both ends of a metal having a predetermined shape is caused to overlap the fixing member, and a part overlapping the fixing member is subjected to pressing. When a resin is used as a deformable body, a deformable body may be formed using a cured resin by a method similar to that in the case of using a metal as a deformable body or a deformable body may be formed through coating using a printer, a spin coater, or the like.

When the power generator 1100A in which a deformable body and a piezoelectric element are apart from each other is manufactured, a plate such as a metal plate or a resin plate may be disposed between the first fixing member 1031 and the second fixing member 1032, and the plate may be taken out after the deformable body is formed.

Second Embodiment

Figure 5:
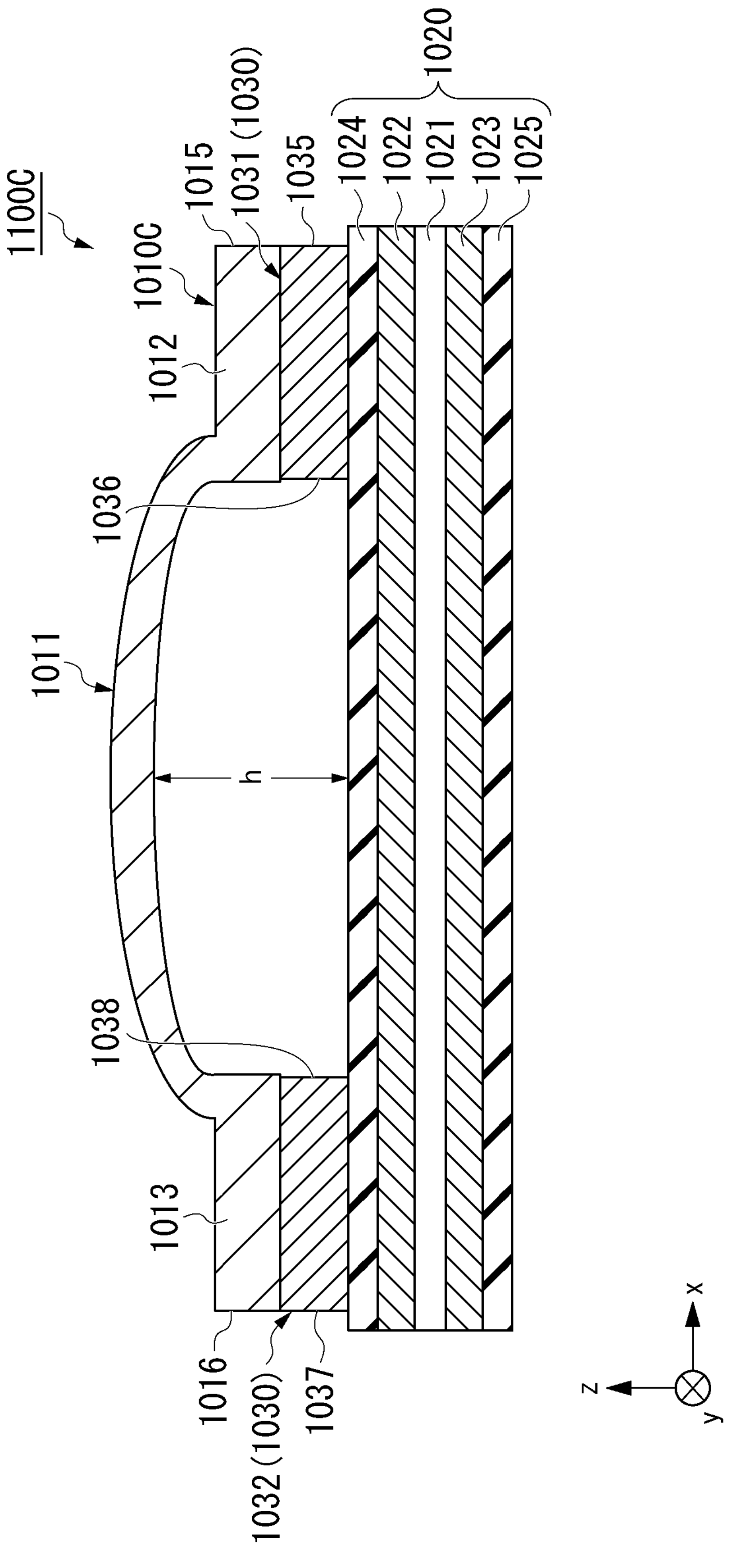
FIG. 5 is a cross-sectional view of a power generator according to a second embodiment.

FIG. 5 is a cross-sectional view of a power generator 1100C according to a second embodiment. The power generator 1100C according to the second embodiment differs from the power generator 1100 according to the first embodiment in shape of a deformable body 1010C. In the power generator 1100C, the same reference signs are applied to the same constituents as the power generator 1100, and description thereof will be omitted.

The power generator 1100C has the deformable body 1010C, the piezoelectric element 1020, and the fixing member 1030. For example, the deformable body 1010C has a protrusion 1011, a first bottom portion 1012, and a second bottom portion 1013. The first bottom portion 1012 and the second bottom portion 1013 are parts respectively overlapping the first fixing member 1031 and the second fixing member 1032 in a plan view in the lamination direction. It is preferable that the shape of the deformable body 1010C be symmetrical in the x direction.

For example, the protrusion 1011 is positioned between the first bottom portion 1012 and the second bottom portion 1013. The protrusion 1011 protrudes in a direction perpendicular to a surface on which the piezoelectric element 1020 extends. The protrusion 1011 is apart from the piezoelectric element 1020 in the z direction compared to the first bottom portion 1012 and the second bottom portion 1013. The shape of the protrusion 1011 can be arbitrarily set, but a cross-sectional shape thereof is a curved shape such as a bow shape, for example. It is preferable that the protrusion 1011 have a shape not overlapping the first bottom portion 1012 and the second bottom portion 1013 in a plan view in the z direction.

A distance h between the protrusion 1011 and the piezoelectric element 1020 is larger than a distance between outer surfaces of the first bottom portion 1012 and the second bottom portion 1013 exposed in the positive z direction and the piezoelectric element 1020. For example, the distance h between the protrusion 1011 and the piezoelectric element 1020 need only be 2 times to 200 times the distance between the outer surfaces of the first bottom portion 1012 and the second bottom portion 1013 exposed in the positive z direction and the piezoelectric element 1020. The distance h between the protrusion 1011 and the piezoelectric element 1020 may be 2.5 mm to 100 mm or may be 5 mm to 50 mm.

The distance h between the protrusion 1011 and the piezoelectric element 1020 may be suitably changed in accordance with the length of the piezoelectric element 1020, the deformable body 1010C, the first bottom portion 1012, or the second bottom portion 1013 in the x direction; the magnitude of stress applied thereto; the material of the deformable body; or the amount of necessary deformation.

Regarding the deformable body 1010C, for example, it is possible to use an iron-based alloy such as carbon steel or stainless steel; a copper-based alloy such as brass, phosphor bronze, nickel silver, or beryllium copper; a metal such as a titanium alloy or a nickel alloy such as Inconel; a resin such as rubbers, polyacetal, polycarbonate, polyamide, or polyurea; or a resin such fiber reinforced plastic (FRP), glass-fiber reinforced plastic (GFRP), or carbon-fiber reinforced plastic (CFRP) obtained by reinforcing a resin with glass fibers, carbon fibers or the like.

For example, the thickness of the deformable body 1010C is 0.05 mm to 10 mm, preferably 0.1 mm to 4.0 mm, and more preferably 0.25 mm to 2 mm.

It is also possible for the power generator 1100C according to the present embodiment to achieve effects similar to those of the power generator 1100 according to the first embodiment. In addition, in the power generator 1100C, the deformable body 1010C has the protrusion 1011 and has a part having a shape inclined toward the fixing member 1030 from the protruding part. For this reason, when stress is applied to the protrusion 1011, the stress in the positive x direction is likely to be propagated to the piezoelectric element 1020 via the first fixing member 1031, and the stress in the negative x direction is likely to be propagated to the second fixing member 1032.

Modification Example 3

Figure 6:
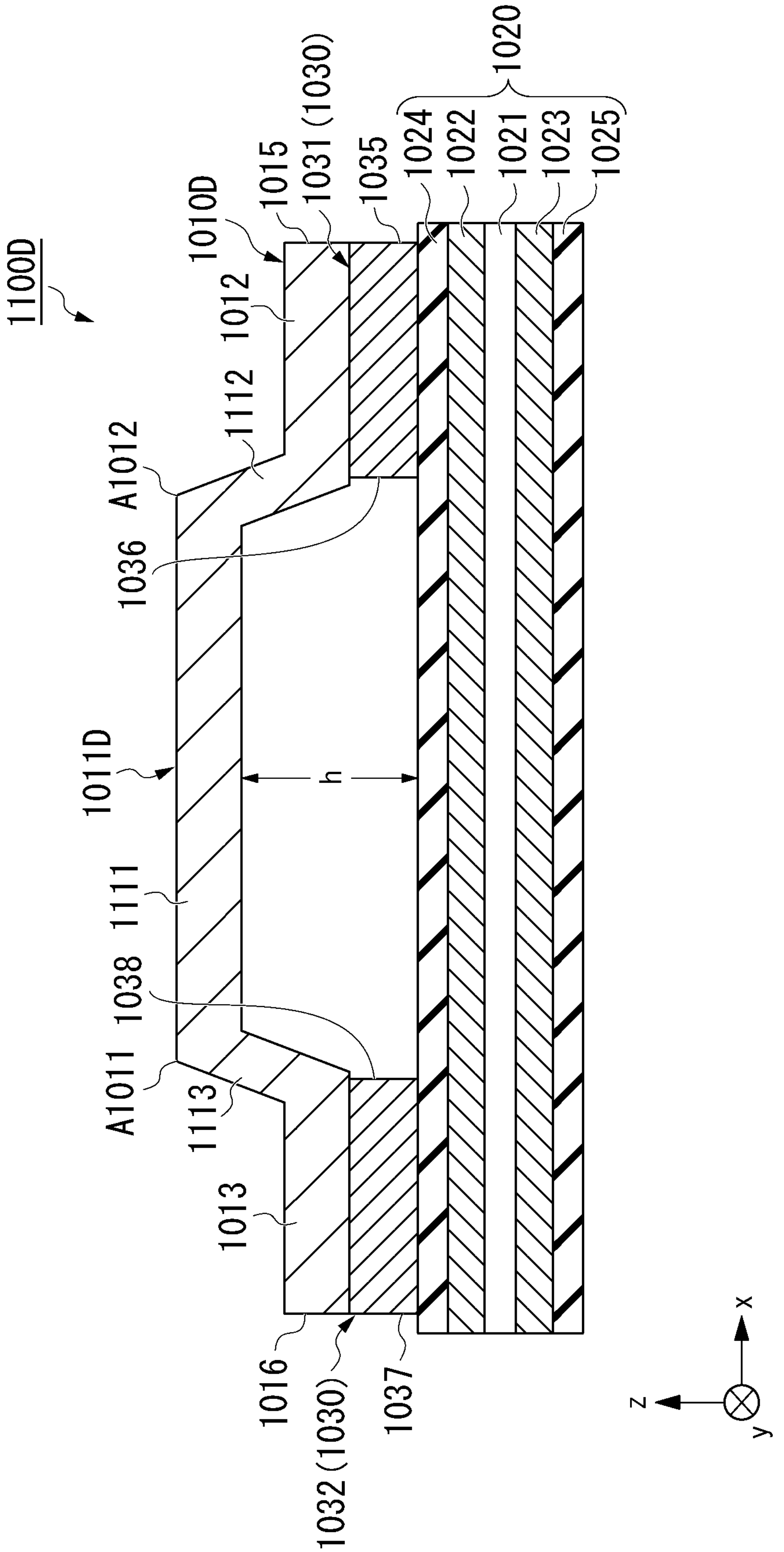
FIG. 6 is a cross-sectional view of a power generator according to a modification example 3.

FIG. 6 is a cross-sectional view of a power generator 1100D according to a modification example 3. The power generator 1100D according to the modification example 3 differs from the power generator 1100C according to the second embodiment in shape of a deformable body 1010D. In the power generator 1100D, the same reference signs are applied to the same constituents as the power generator 1100C, and description thereof will be omitted.

For example, the deformable body 1010D has a protrusion 1011D, the first bottom portion 1012, and the second bottom portion 1013. For example, the protrusion 1011D has a bent cross-sectional shape. For example, it has a polygonal shape. For example, the protrusion 1011D includes a plurality of apexes A1011 and A1012 exposed in the positive z direction. In addition, the protrusion 1011D has an upper chord portion 1111 and inclined portions 1112 and 1113. For example, the upper chord portion 1111 is a part extending parallel to the piezoelectric element 1020, and it extends in the x direction. For example, the inclined portion 1112 is a member connecting the upper chord portion 1111 and the first bottom portion 1012 to each other and extends in a direction toward the first fixing member 1031 from the apex A1011. For example, the inclined portion 1113 is a member connecting the upper chord portion 1111 and the second bottom portion 1013 to each other and extends in a direction toward the second fixing member 1032 from the apex A1012.

FIG. 6 has illustrated an example in which the inclined portions linearly extend, but the power generator 1100D is not limited to this example. For example, in the power generator 1100D, each of the inclined portions 1112 and 1113 may have a structure in which a plurality of linearly extending members are combined. That is, the apexes may be included within the inclined portions 1112 and 1113.

It is also possible for the power generator 1100D according to the modification example 3 to achieve effects similar to those of the power generator 1100C according to the second embodiment.

Modification Example 4

Figure 7:
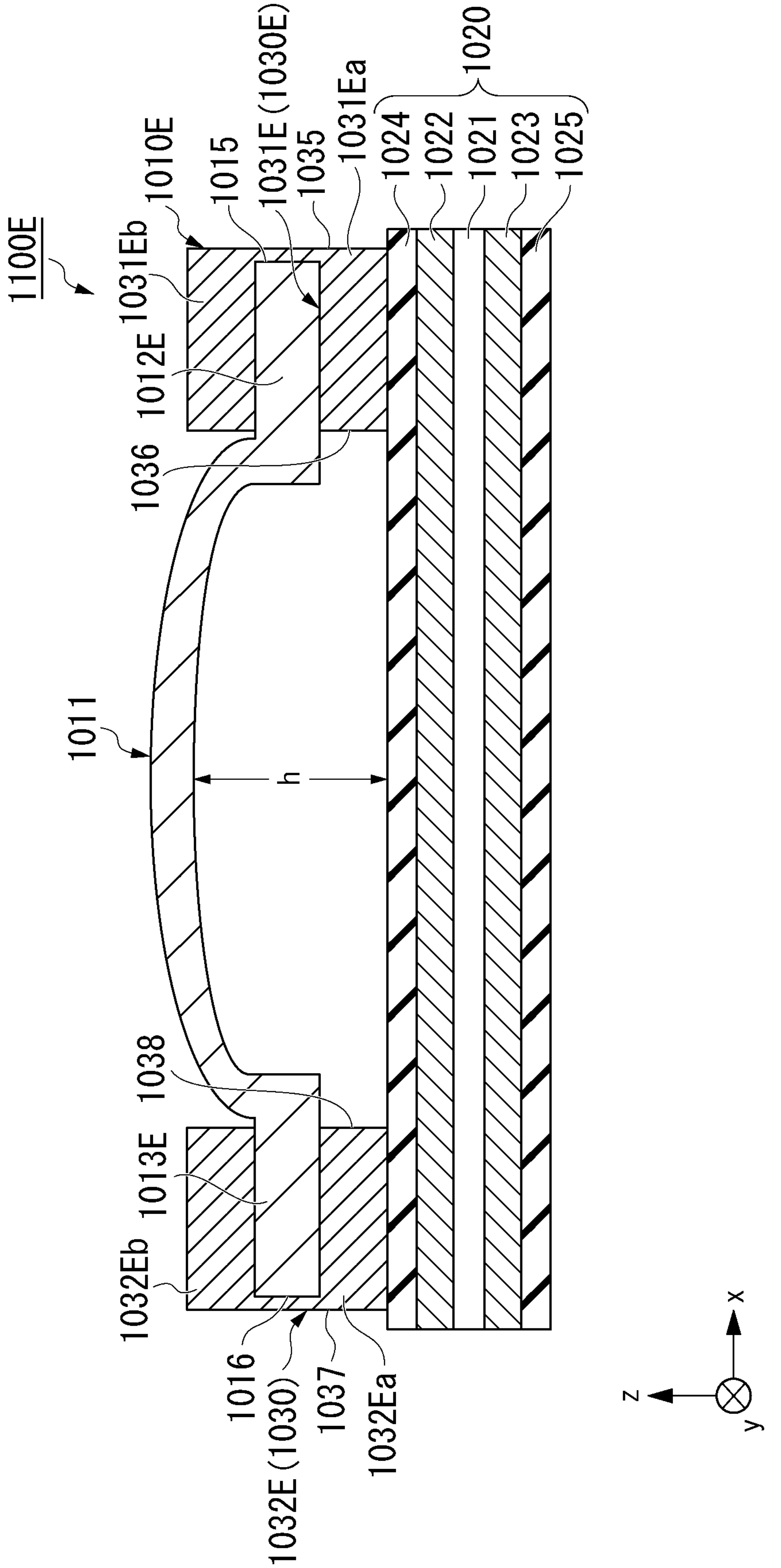
FIG. 7 is a cross-sectional view of a power generator according to a modification example 4.
Figure 8:
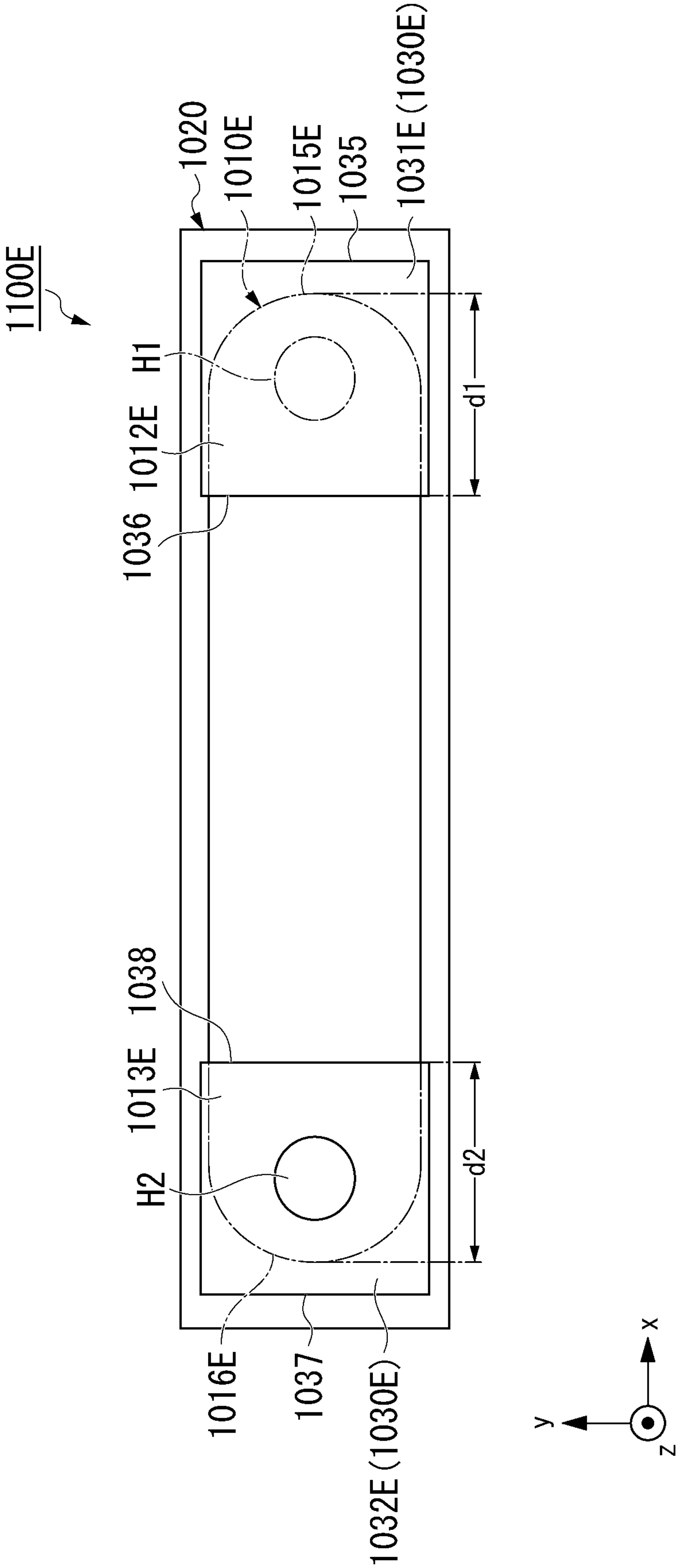
FIG. 8 is a top view of the power generator according to the modification example 4.

FIG. 7 is a cross-sectional view of a power generator 1100E according to a modification example 4, and FIG. 8 is a top view of the power generator 1100E according to the modification example 4. The power generator 1100E according to the modification example 4 differ from the power generator 1100C according to the second embodiment in shapes of a first fixing member 1031E and a second fixing member 1032E. In the power generator 1100E, the same reference signs are applied to constitutions similar to those of the power generator 1100C, and description thereof will be omitted.

The power generator 1100E has a deformable body 1010E, the piezoelectric element 1020, and a fixing member 1030E.

The deformable body 1010E has an oval shape in a plan view in the z direction, for example. The present modification example will be described using an example in which a shape in a plan view in the z direction is an oval shape as illustrated in FIG. 7, but it may be a rectangular shape or the like. For example, in the deformable body 1010E, end portions of a first bottom portion 1012E and a second bottom portion 1013E in the x direction are rounded. In this manner, the first bottom portion 1012E and the second bottom portion 1013E may have a bow shape. In the deformable body 1010E, each of the first bottom portion 1012E and the second bottom portion 1013E may have at least one of penetration holes H1 and H2, and each of the first bottom portion 1012E and the second bottom portion 1013E may have two or more penetration holes. The penetration holes H1 and H2 respectively penetrate the first bottom portion 1012E and the second bottom portion 1013E in the z direction.

In each of the first bottom portion 1012E and the second bottom portion 1013E, an occupied area of the penetration hole in a plan view in the z direction is half or smaller than the area of each of the first bottom portion 1012E and the second bottom portion 1013E, for example. Due to the constitution in which the area of the penetration hole is not excessively large, it is possible to curb degradation of a joining force and a strength or occurrence of unexpected stress concentration. Moreover, a part overlapping the penetration hole of the deformable body 1010E in the fixing member 1030E may have a penetration hole. Since the deformable body 1010E has a penetration hole, it is possible to simply perform drawing out of an electrode (wiring) from the piezoelectric element through this hole.

For example, the first fixing member 1031E is an integrated fixing member. For example, the first fixing member 1031E has a first part 1031Ea positioned in the negative z direction of the first bottom portion 1012E of the deformable body, a second part 1031Eb positioned in the positive z direction of the first bottom portion 1012E of the deformable body, and a part extending in the same plane as the first bottom portion 1012E of the deformable body. For example, the second fixing member 1032E is an integrated fixing member. For example, the second fixing member 1032E has a first part 1032Ea positioned in the negative z direction of the second bottom portion 1013E of the deformable body, a second part 1032Eb positioned in the positive z direction of the second bottom portion 1013E of the deformable body, and a part extending in the same plane as the second bottom portion 1013E of the deformable body. For example, in a plan view in the z direction, the first fixing member 1031E and the second fixing member 1032E may extend in the positive x direction and the negative x direction beyond the first end portion 1015 and the second end portion 1016, respectively. For example, the first parts 1031Ea and 1032Ea are positioned between the piezoelectric element 1020 and the deformable body 1010E. The second parts 1031Eb and 1032Eb cover at least a part of the deformable body 1010E. For example, in a plan view in the z direction, the second parts 1031Eb and 1032Eb is disposed to overlap the first bottom portion 1012E and the second bottom portion 1013E of the deformable body 1010E. The fixing member 1030E may further have third parts accommodated inside the penetration holes H1 and H2. FIG. 7 has illustrated an example in which the first fixing member 1031E and the second fixing member 1032E have a part extending in the same plane as the first bottom portion 1012E and the second bottom portion 1013E, but they may not have the part.

The fixing member 1030E may be larger than the deformable body in the y direction. In addition, the fixing member 1030E is disposed such that it fits in the piezoelectric element 1020 in the y direction.

It is also possible for the power generator 1100E according to the modification example 4 to achieve effects similar to those of the power generator 1100C according to the second embodiment. In addition, since the deformable body 1010E is sandwiched by the fixing member 1030E in the lamination direction and the fixing member 1030E has a part not overlapping the deformable body 1010E in a plan view in the z direction, peeling of the fixing member 1030E can be curbed.

The deformable body 1010C, 1010D, or 1010E used in the power generator according to the second embodiment can be obtained by performing working of a metal plate into a predetermined shape using a bending machine, for example.

In the first embodiment, the second embodiment, and the modification examples described above, a constitution in a case of placing a power generator on a flat placement surface has been exemplified in illustration, but it can also be placed on a non-flat placement surface. For example, the power generators according to the foregoing embodiments can also be placed on a curved placement surface or the like. When the power generators according to the foregoing embodiments are placed on a curved surface, at least one of the first bottom portion 1012, the second bottom portion 1013, and the piezoelectric element 1020 of the deformable body 1010 may have a shape along a curved surface, or all of them may have a shape along a curved surface. That is, the first bottom portion 1012, the second bottom portion 1013, and the piezoelectric element 1020 of the deformable body 1010 may have a shape corresponding to the shape of the placement surface. In addition, the fixing member 1030 may also have a shape corresponding to the shape of the placement surface.

[Power Generation System]

Power generation can be performed using the power generators according to the foregoing embodiments. For example, a power generation system according to the present embodiment includes the power generator according to the foregoing embodiments, and a stress applying mechanism that applies stress to a deformable body of the power generator. The power generation system may include a plurality of power generators which are electrically connected to each other, and stress applying mechanisms as many as the number of the power generators.

For example, the power generation system performs power generation by applying stress to the deformable body included in the power generator using the stress applying mechanism. For example, regarding stress applied to the deformable body from outside, amounts of deformation of the deformable body and the piezoelectric element are controlled within an elastic region. That is, stress applied to the deformable body from outside is smaller than yield points of the deformable body and the piezoelectric element.

In the power generation system according to the present embodiment, since the strength of stress is being controlled, elasticity of the deformable body 1010 can be maintained, and efficient power generation can be repeatedly performed.

Third Embodiment

Figure 9:
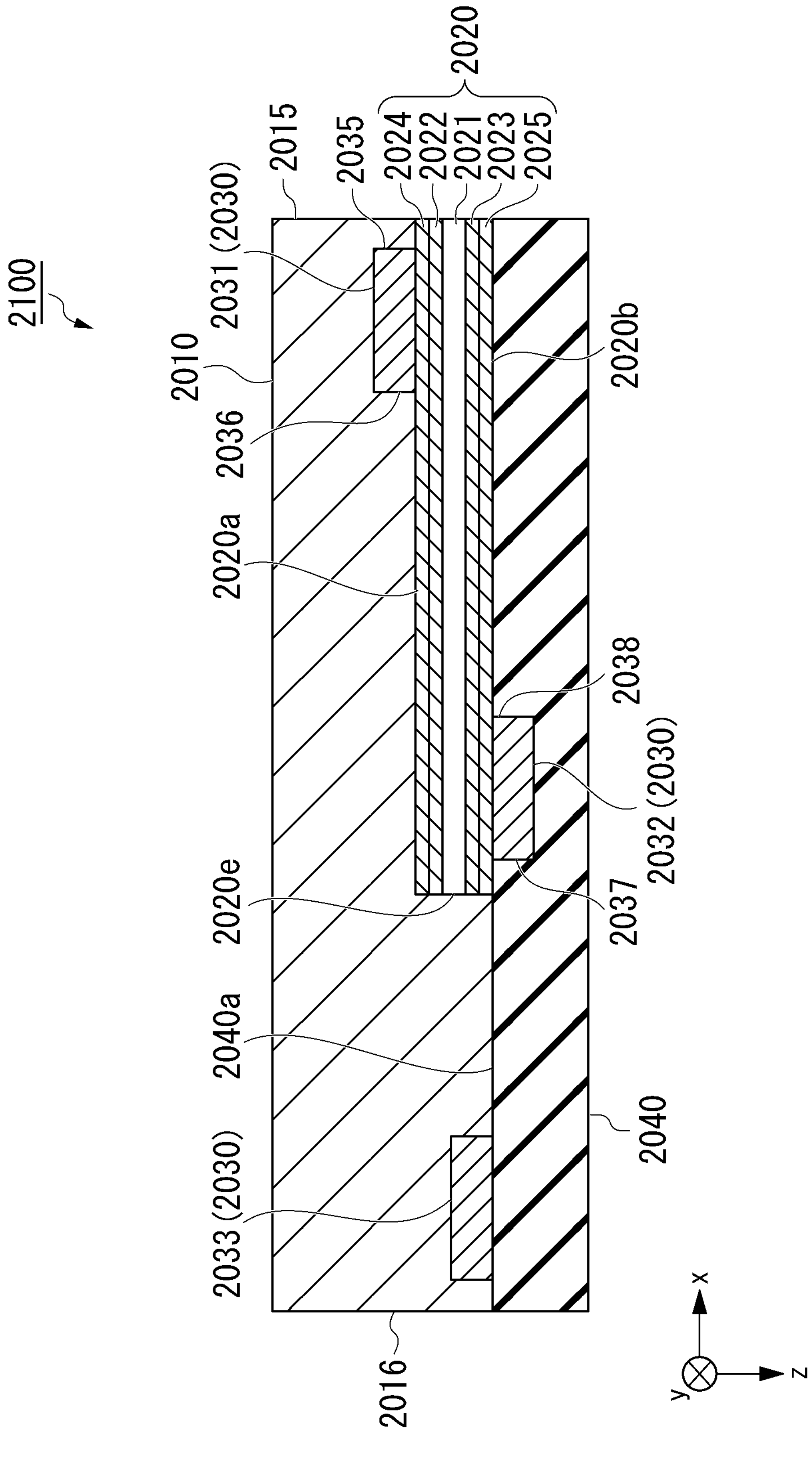
FIG. 9 is a cross-sectional view of a power generator according to a third embodiment.
Figure 10:
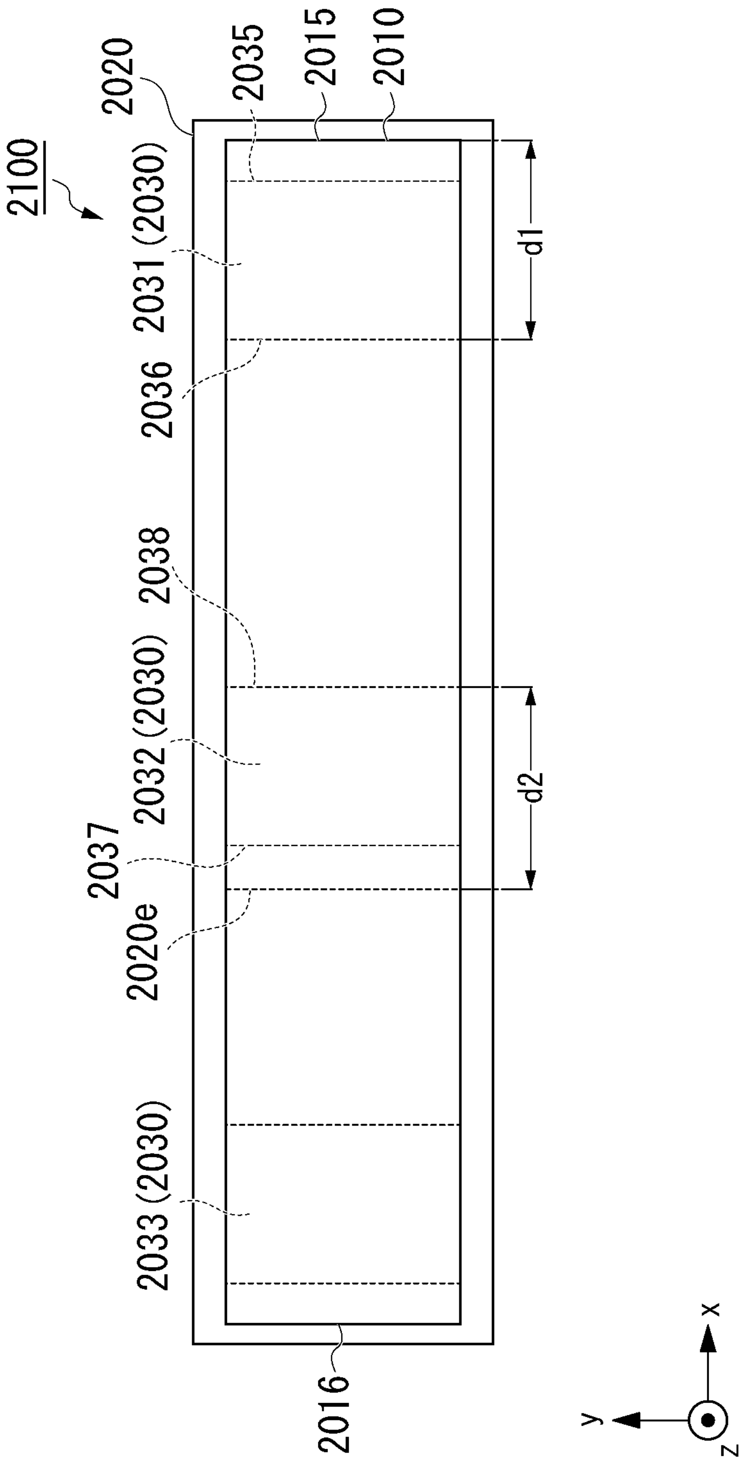
FIG. 10 is a top view of the power generator according to the third embodiment.

FIG. 9 is a cross-sectional view of a power generator 2100 according to a third embodiment, and FIG. 10 is a top view of the power generator 2100 according to the third embodiment. The power generator 2100 has a deformable body 2010, the piezoelectric element 2020, a fixing member 2030, and a support body 2040. The fixing member 2030 has a first fixing member 2031, a second fixing member 2032, and a third fixing member 2033.

(Piezoelectric Element)

For example, the piezoelectric element 2020 has a piezoelectric film 2021, a first electrode 2022, a second electrode 2023, and protective layers 2024 and 2025. The first electrode 2022 and the second electrode 2023 sandwich the piezoelectric film therebetween in the thickness direction.

The piezoelectric element 2020 is a flexible piezoelectric element. For example, the piezoelectric element 2020 is formed to extend in the xy plane when it is placed on a flat placement surface. An end portion of the piezoelectric element 2020 in the negative x direction will be generically referred to as an inner end portion 2020*e*. For example, the distance d2 from the inner end portion 2020*e* of the piezoelectric element 2020 to a second end portion 2038 of the second fixing member 2032 may be 0.01 times to 0.3 times the size of the piezoelectric element in the x direction or more preferably 0.02 times to 0.15 times.

The synthetic Young's modulus of the piezoelectric element 2020 can be measured by the same method as the method described in the first embodiment.

(Piezoelectric Film)

The piezoelectric film 1021 used in the first embodiment can be used as the piezoelectric film 2021 of the third embodiment.

The Young's modulus of the piezoelectric film 2021 can be measured by the same method as the method described in the first embodiment.

(Electrode)

The first electrode 2022 and the second electrode 2023 are respectively disposed on one main surface and the other main surface of the piezoelectric film 2021, and the piezoelectric film 2021 is sandwiched between the first electrode 2022 and the second electrode 2023. Other constitutions are similar to those of the first electrode 1022, the second electrode 1023, and the power generator 1100 in the first embodiment.

(Protective Layer)

The protective layers 2024 and 2025 may be formed to overlap at least one outer surface of the main surface of the first electrode 2022 and the main surface of the second electrode 2023 or may be disposed on both thereof. Other constitutions, a method for measuring Young's modulus, and the like are similar to those of the protective layers 1024 and 1025 in the first embodiment.

(Fixing Member)

The fixing member 2030 has the first fixing member 2031, the second fixing member 2032, and the third fixing member 2033. In this specification, the first fixing member 2031, the second fixing member 2032, and the third fixing member 2033 may be generically referred to as the fixing member 2030. The fixing member 2030 is a material for fixing any two of the deformable body 2010 (which will be described below), the piezoelectric element 2020, and the support body 2040 to each other.

The first fixing member 2031 is disposed on a first main surface 20*a* side of the piezoelectric element 2020. The second fixing member 2032 is disposed on a second main surface 2020*b* side of the piezoelectric element 2020. The third fixing member 2033 is disposed between the deformable body 2010 (which will be described below) and the support body 2040 on a first main surface 2040*a* side of the support body 2040 with a predetermined gap from the inner end portion 2020*e* of the piezoelectric element 2020.

The first fixing member 2031 and the second fixing member 2032 are disposed such that they fit within a formation range of the piezoelectric element 2020 in a plan view in the thickness direction. In addition, the third fixing member 2033 is disposed on an outward side of the end portion of the piezoelectric element 2020.

For example, the first fixing member 2031 and the second fixing member 2032 are disposed apart from each other in the x direction. For example, the first fixing member 2031 and the second fixing member 2032 are preferably provided at positions close to the end portions of the piezoelectric element 2020 in the longitudinal direction and more preferably come into contact with the end portions of the piezoelectric element 2020 in the longitudinal direction. In this manner, when the first fixing member 2031 and the second fixing member 2032 are disposed far apart from each other, the piezoelectric element 2020 can be significantly deformed.

In the following description, end portions of the first fixing member 2031 and the second fixing member 2032 on sides closer to the end portions of the piezoelectric element 2020 in the longitudinal direction will be generically referred to as first end portions 2035 and 2037, and an end portion of the first fixing member 2031 on a side closer to the second fixing member and an end portion of the second fixing member 2032 on a side closer to the first fixing member 2031 will be generically referred to as second end portions 2036 and 2038, respectively.

A material, a method for testing a shearing adhesion strength, and the like of the fixing member 2030 are similar to those of the fixing member 1030 in the first embodiment.

(Deformable Body)

In the deformable body 2010, one end is fixed to the piezoelectric element 2020 with the first fixing member 2031 therebetween, and the other end is fixed to the support body 2040 with the third fixing member 2033 therebetween. For example, in a plan view in the thickness direction, the deformable body 2010 overlaps the support body 2040 and overlaps at least a part of the third fixing member 2033, the piezoelectric element 2020, and the first fixing member 2031 and the second fixing member 2032 formed therein.

When the deformable body 2010 and the first fixing member 2031 partially overlap each other, it is preferable that the overlapping part be a part of the first fixing member 2031 on a side closer to the second fixing member 2032. Similarly, when the deformable body 2010 and the third fixing member 2033 partially overlap each other, it is preferable that the overlapping part be a part of the third fixing member 2033 on a side closer to the second fixing member 2032.

The deformable body 2010 of the present embodiment covers the first fixing member 2031 and the third fixing member 2033 and fills, for example, a space between the second end portions 2036 and 2038 of the first fixing member 2031 and the second fixing member 2032. For example, the deformable body 2010 comes into contact with a part on the first main surface 20*a* of the piezoelectric element 2020 not overlapping the first fixing member 2031. In addition, for example, the deformable body 2010 comes into contact with a part on the first main surface 2040*a* of the support body 2040 not overlapping the piezoelectric element 2020 and the third fixing member 2033.

For example, the deformable body 2010 is formed to extend along the xy plane. For example, in the deformable body 2010, a shape in a plan view in the z direction is a rectangular shape, and the length in the x direction is longer than the length in the y direction. One end portion of the deformable body 2010 in the positive x direction will be generically referred to as a first end portion 2015, and the other end portion thereof will be generically referred to as a second end portion 2016. For example, the deformable body 2010 is disposed such that it fits inside the piezoelectric element 2020 in a plan view in the z direction.

A material, a method for measuring Young's modulus, and the like of the deformable body 2010 are similar to those of the deformable body 1010 in the first embodiment.

For example, the distance d1 from the first end portion 2015 of the deformable body 2010 to the second end portion 2036 of the first fixing member 2031 may be 0.01 times to 0.3 times the size of the piezoelectric element in the x direction or more preferably 0.02 times to 0.15 times.

This distance d1 and the distance d2 between the piezoelectric element 2020 and the second fixing member 2032 may be the same as each other or may differ from each other.

When stress is applied from outside, the deformable body 2010 is deformed in a direction in which the distance between the first fixing member 2031 and the second fixing member 2032 is lengthened such that the first fixing member 2031 is pulled outward. At this time, the first fixing member 2031 and the second fixing member 2032 propagates stress applied from the deformable body 2010 to the piezoelectric element 2020. The direction of stress propagated to the piezoelectric element 2020 by the deformable body 2010 via the first fixing member 2031 in the x direction and the direction of stress propagated to the piezoelectric element 2020 by the deformable body 2010 via the second fixing member 2032 in the x direction are opposite to each other, for example.

In the power generator 2100 according to the present embodiment, stress received by the deformable body 2010 from outside is applied to the piezoelectric element 2020 via the first fixing member 2031 and the second fixing member 2032 so that the piezoelectric element 2020 can be significantly deformed in the in-plane direction. Therefore, in the power generator 2100 according to the present embodiment, a large amount of power generation can be obtained.

The power generator 2100 according to the present embodiment can also be utilized as a stress sensor using the amount of obtained power generation as an output.

(Support Body)

The support body 2040 is a member which comes into contact with the second main surface 2020*b* of the piezoelectric element 2020 on the first main surface 2040*a* side and supports the piezoelectric element 2020. The third fixing member 2033 is formed in the vicinity of one end of the support body 2040, and the end portion of the deformable body 2010 is fixed to the support body 2040 via this third fixing member 2033. For example, in a plan view in the thickness direction, the support body 2040 need only overlap or be larger than the deformable body 2010 and the piezoelectric element 2020.

The support body 2040 of the present embodiment may cover the second fixing member 2032, and the second fixing member 2032 may be on an upper surface of the support body 2040. For example, the support body 2040 can be coated with an adhesive thereon, and the end portion of the piezoelectric element 2020 can be fixed thereto.

In addition, for example, the support body 2040 may come into contact with a part of the deformable body 2010 not overlapping the piezoelectric element 2020.

The Young's modulus of the support body 2040 is larger than the synthetic Young's modulus of the piezoelectric element 2020 described above. For example, the Young's modulus of the support body 2040 can be measured under the following conditions using a tension tester ("Autograph AG-I" manufactured by Shimadzu Corporation) in conformity with JIS K 7113.

Test piece (dumbbell No. 2) thickness: 1 mm

Crosshead speed: 100 mm/min

Load cell: 100 N

Measurement temperature: 23° ° C.

Regarding a material constituting the support body 2040, it is preferable to select a material having a low coefficient of dynamic friction with respect to the protective layer 2025. Accordingly, the piezoelectric element 2020 is more likely to be deformed, and deterioration due to friction between the protective layer 2025 and the support body 2040 can be curbed.

Modification Example 1 of Third Embodiment

Figure 11:
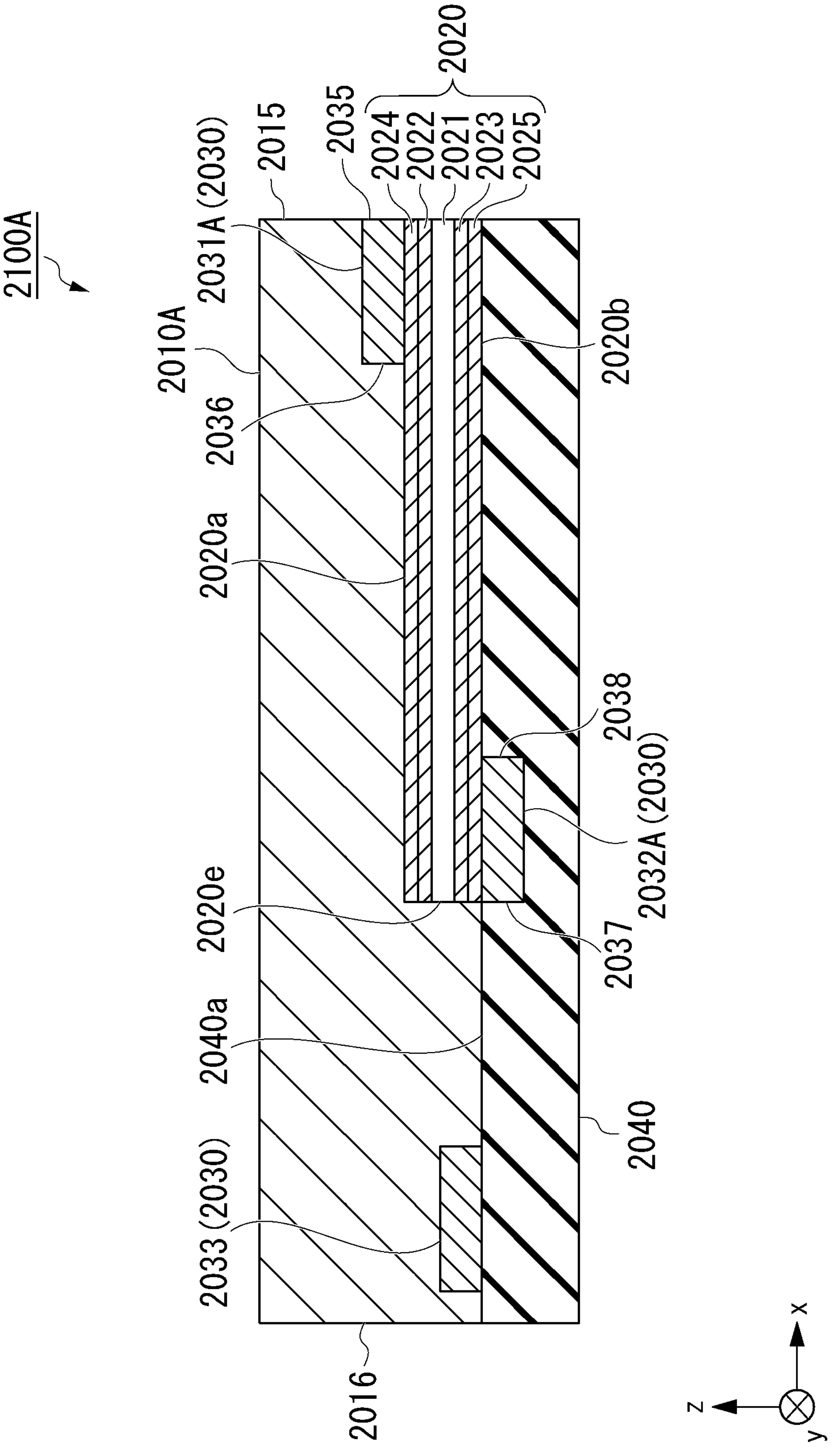
FIG. 11 is a cross-sectional view of a power generator according to a modification example 1 of the third embodiment.

FIG. 11 is a cross-sectional view of a power generator 2100A according to a modification example 1 of the third embodiment. The power generator 2100A according to the modification example 1 differs from the power generator 2100 according to the third embodiment in disposition of a first fixing member 2031A and a second fixing member 2032A with respect to the piezoelectric element 2020. In the modification example 1, the same reference signs are applied to the same constituents as the third embodiment, and description thereof will be omitted.

In the first fixing member 2031A of the power generator 2100A, the first end portion 2035 is formed to coincide with the end portion of the piezoelectric element 2020 on the outward side. In addition, in the second fixing member 2032A of the power generator 2100A, the first end portion 2037 is formed to coincide with the inner end portion 2020*e* of the piezoelectric element 2020.

It is also possible for such a power generator 2100A according to the modification example 1 to achieve effects similar to those of the power generator 2100 according to the third embodiment. In addition, in the power generator 2100A according to the modification example 1, since the first fixing member 2031A and the second fixing member 2032A are respectively formed at positions which respectively coincide with one end and the other end of the piezoelectric element 2020, the piezoelectric element 2020 can be more significantly deformed and the amount of power generation can be increased.

Modification Example 2 of Third Embodiment

Figure 12:
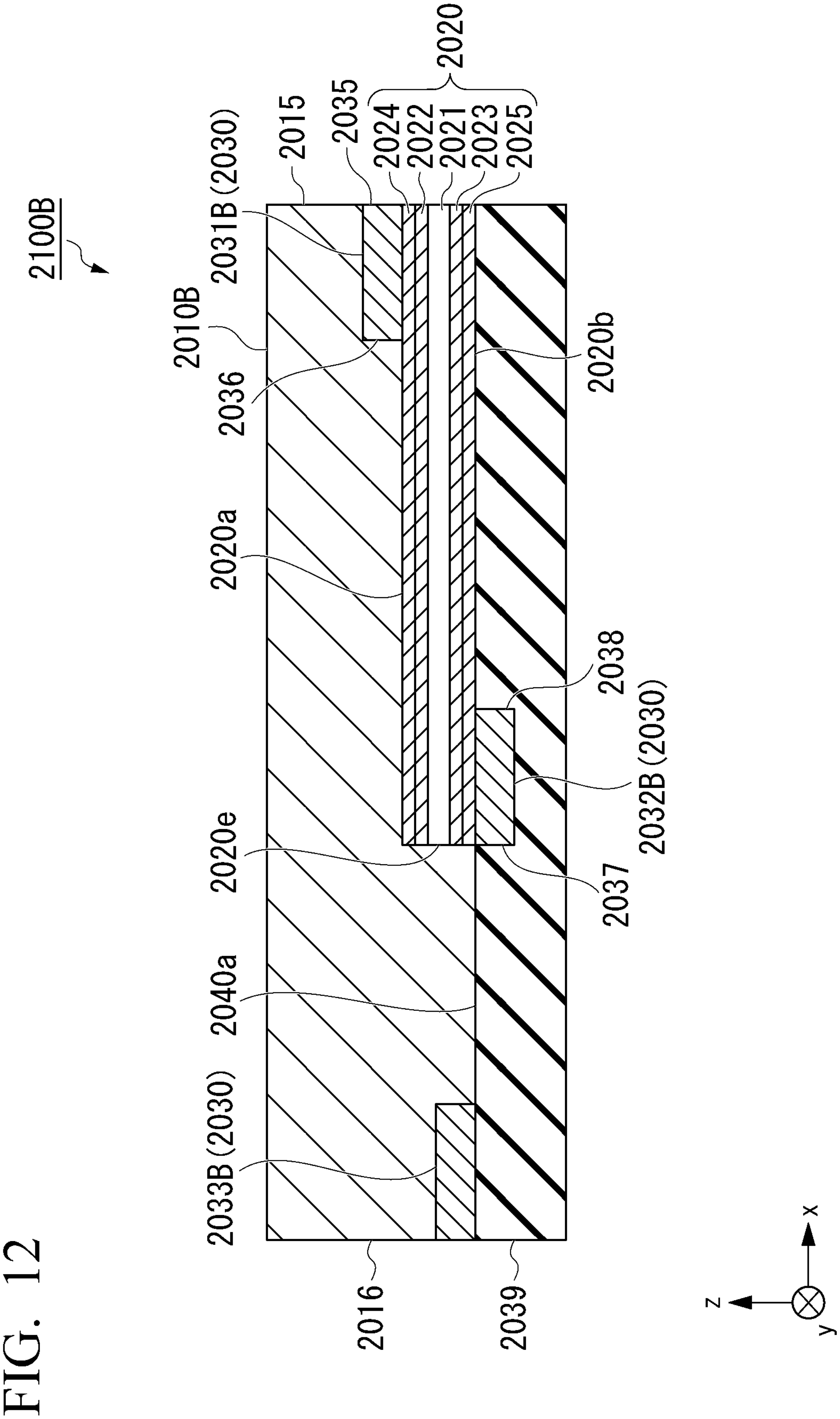
FIG. 12 is a cross-sectional view of a power generator according to a modification example 2 of the third embodiment.

FIG. 12 is a cross-sectional view of a power generator 2100B according to a modification example 2 of the third embodiment. The power generator 2100B according to the modification example 2 is the same as the modification example 1 of the third embodiment in disposition of a first fixing member 2031B and a second fixing member 2032B with respect to the piezoelectric element 2020. Moreover, it differs from the power generator 2100 in disposition of the third fixing member 2033. In the modification example 2, the same reference signs are applied to the same constituents as the third embodiment, and description thereof will be omitted.

In the first fixing member 2031B of the power generator 2100B, the first end portion 2035 is formed to coincide with the end portion of the piezoelectric element 2020 on the outward side. In addition, in the second fixing member 2032B in the power generator 2100B, the first end portion 2037 is formed to coincide with the inner end portion 2020*e* of the piezoelectric element 2020.

Moreover, in a third fixing member 2033B of the power generator 2100B, a first end portion 2039 is formed to coincide with the second end portion 2016 of a deformable body 2010B.

It is also possible for such a power generator 2100B according to the modification example 2 to achieve effects similar to those of the power generators 2100 and 2100A according to the third embodiment and the modification example 1 of the third embodiment. In addition, in the power generator 2100B according to the modification example 2, since the first end portion 2039 of the third fixing member 2033B is formed to coincide with the second end portion 2016 of the deformable body 2010B, the amount of deformation of the deformable body 2010B can be increased, the piezoelectric element 2020 can be more significantly deformed, and the amount of power generation can be increased.

Modification Example 3 of Third Embodiment

Figure 13:
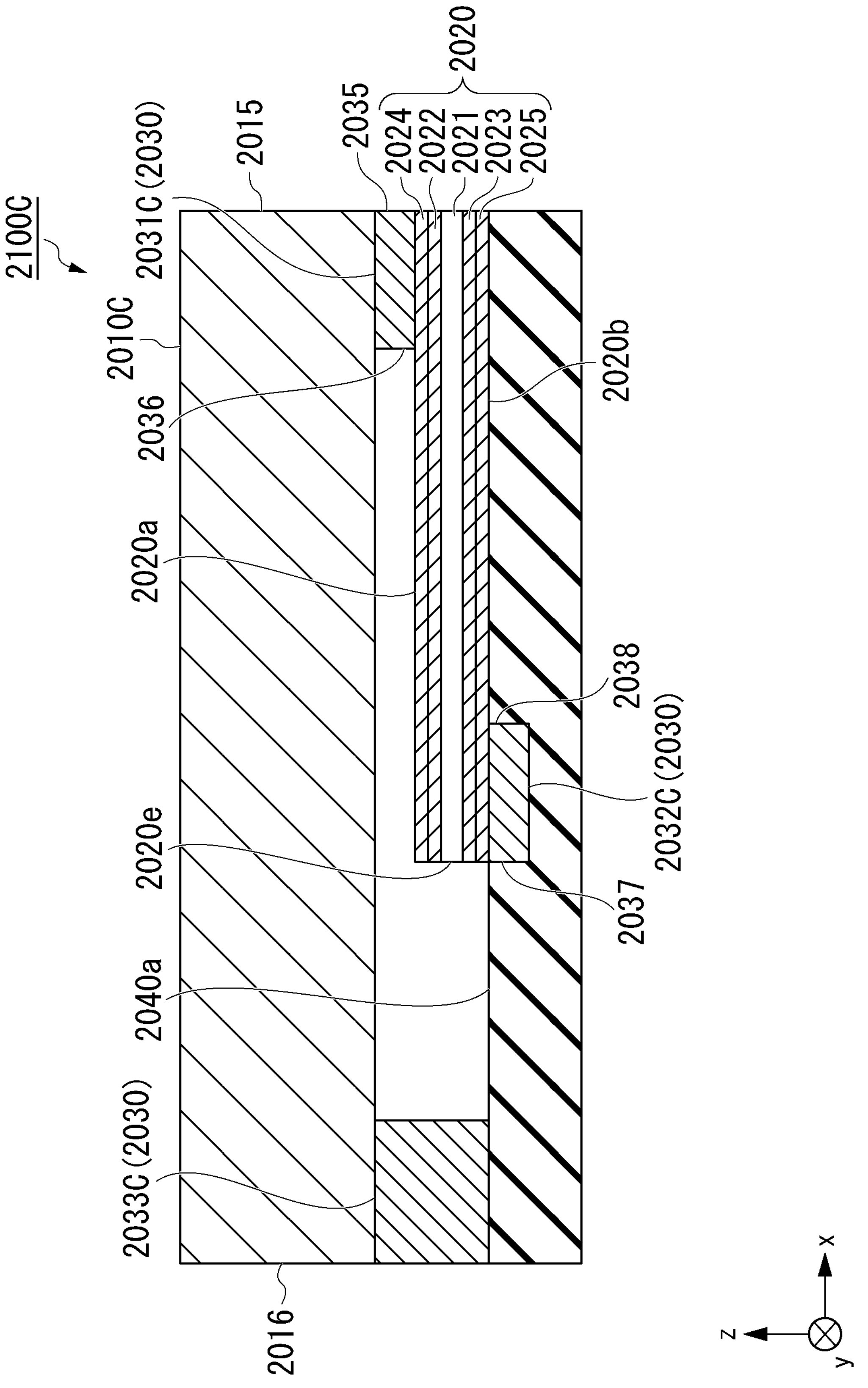
FIG. 13 is a cross-sectional view of a power generator according to a modification example 3 of the third embodiment.

FIG. 13 is a cross-sectional view of a power generator 2100C according to a modification example 3 of the third embodiment. The power generator 2100C according to the modification example 3 differs from the power generator 2100B according to the modification example 2 of the third embodiment in shape of a deformable body 2010C. In the modification example 2, the same reference signs are applied to the same constituents as the third embodiment, and description thereof will be omitted.

The deformable body 2010C is disposed apart from the piezoelectric element 2020 in the z direction. For example, a distance between the deformable body 2010C and the piezoelectric element 2020 in the z direction is the same as the thickness of a first fixing member 2031C. In addition, the thickness of a third fixing member 2033C is the sum of the thickness of the third fixing member 2033 in the third embodiment and a thickness corresponding to the distance between the deformable body 2010C and the piezoelectric element 2020 described above.

It is also possible for the power generator 2100C according to the modification example 3 to achieve effects similar to those of the power generator 2100 according to the third embodiment. In addition, in the power generator 2100C according to the modification example 3, since the deformable body 2010C and the piezoelectric element 2020 are apart from each other, no frictional heat is generated between the deformable body 2010C and the piezoelectric element 2020. For this reason, conversion of stress propagated to the piezoelectric element 2020 into frictional heat can be curbed. Therefore, in the power generator 2100C according to the modification example 3, the piezoelectric element 2020 can be more significantly deformed, and the amount of power generation can be increased.

The power generator of the third embodiment can be formed into more various forms other than those of the modification examples described above.

For example, the fixing member 2032 and the fixing member 2033 can also be formed using one continuous integrated member. Accordingly, the power generator can have a simplified constitution and can be manufactured at lower costs.

In addition, for example, the fixing member 2031 can also be formed to be joined to the inner end portion 2020*e* of the piezoelectric element 2020 and the second main surface 2020*b* and cover one side of the piezoelectric element 2020.

Moreover, for example, the fixing member 2032 can also be formed to be joined to the inner end portion 2020*e* of the piezoelectric element 2020 and the first main surface 20*a* and cover the other side of the piezoelectric element 2020.

Method for Manufacturing Power Generator

Next, an example of a method for manufacturing a power generator will be described. The method for manufacturing a power generator according to the present embodiment has a step of preparing a piezoelectric element, a step of preparing a support body, a step of disposing a first main surface and a second main surface of a piezoelectric element and fixing members (a first fixing member, a second fixing member, and a third fixing member) for a support body, and a step of disposing a deformable body.

In the step of preparing a piezoelectric element, the first electrode 2022, the second electrode 2023, the piezoelectric film 2021, and the protective layers 2024 and 2025 are formed in a predetermined lamination order. The piezoelectric film 2021 is subjected to poling processing or the like such that desired piezoelectric characteristics are manifested. The piezoelectric film 2021 which is molded into a film may be used, or a base material in which the first electrode 2022 and the second electrode 2023 are formed on the protective layers 2024 and 2025 may be coated with a piezoelectric material which has dissolved in a solution. The first electrode 2022 and the second electrode 2023 are formed by forming aluminum, platinum, gold, silver, or the like by a physical vapor deposition method or performing drying or sintering after coating a paste obtained by dispersing silver or copper powder in a resin and a solution.

For example, the protective layers 2024 and 2025 can be formed by performing lamination with a thermoplastic resin film such as a PET film from both surfaces of the piezoelectric film 2021 in which electrodes are respectively formed on both surfaces, or performing coating of a resin which has dissolved in a solution through coating, dipping, or the like. The protective layers 2024 and 2025 may be constituted of a plurality of layers.

In addition, a plurality of layers may be laminated in each of these layers such that the piezoelectric film 2021 is electrically connected thereto in series or in parallel.

For example, the fixing member 2030 may be formed by pasting a predetermined adhesive at two locations on the main surface of the piezoelectric element 2020. For example, a fixing tool such as a screw or a clamp, an adhesive tape, or the like can also be used.

In the step of preparing a piezoelectric element, a piezoelectric film, an electrode, and a protective layer are formed in a predetermined lamination order.

For example, the fixing member is formed by pasting a predetermined adhesive at three locations including one end portion of the piezoelectric element on the first main surface side, the end portion on the second main surface side, and one end portion of the support member.

In the step of disposing a deformable body, when a metal is used as a deformable body, first, a metal is subjected to working into a predetermined shape through punching, debossing, or the like. At this time, a location overlapping the fixing member when a piezoelectric element is caused to overlap may be recessed. Next, both ends of a metal having a predetermined shape is caused to overlap each of the first fixing member and the third fixing member, and parts overlapping these fixing members are subjected to pressing. When a resin is used as a deformable body, a deformable body may be formed using a cured resin by a method similar to that in the case of using a metal as a deformable body or a deformable body may be formed through coating using a printer, a spin coater, or the like.

When the power generator 2100C in which a deformable body and a piezoelectric element are apart from each other is manufactured, a plate such as a metal plate or a resin plate may be disposed between the first fixing member and the second fixing member, and the metal plate may be taken out after the deformable body is formed.

Fourth Embodiment

Figure 14:
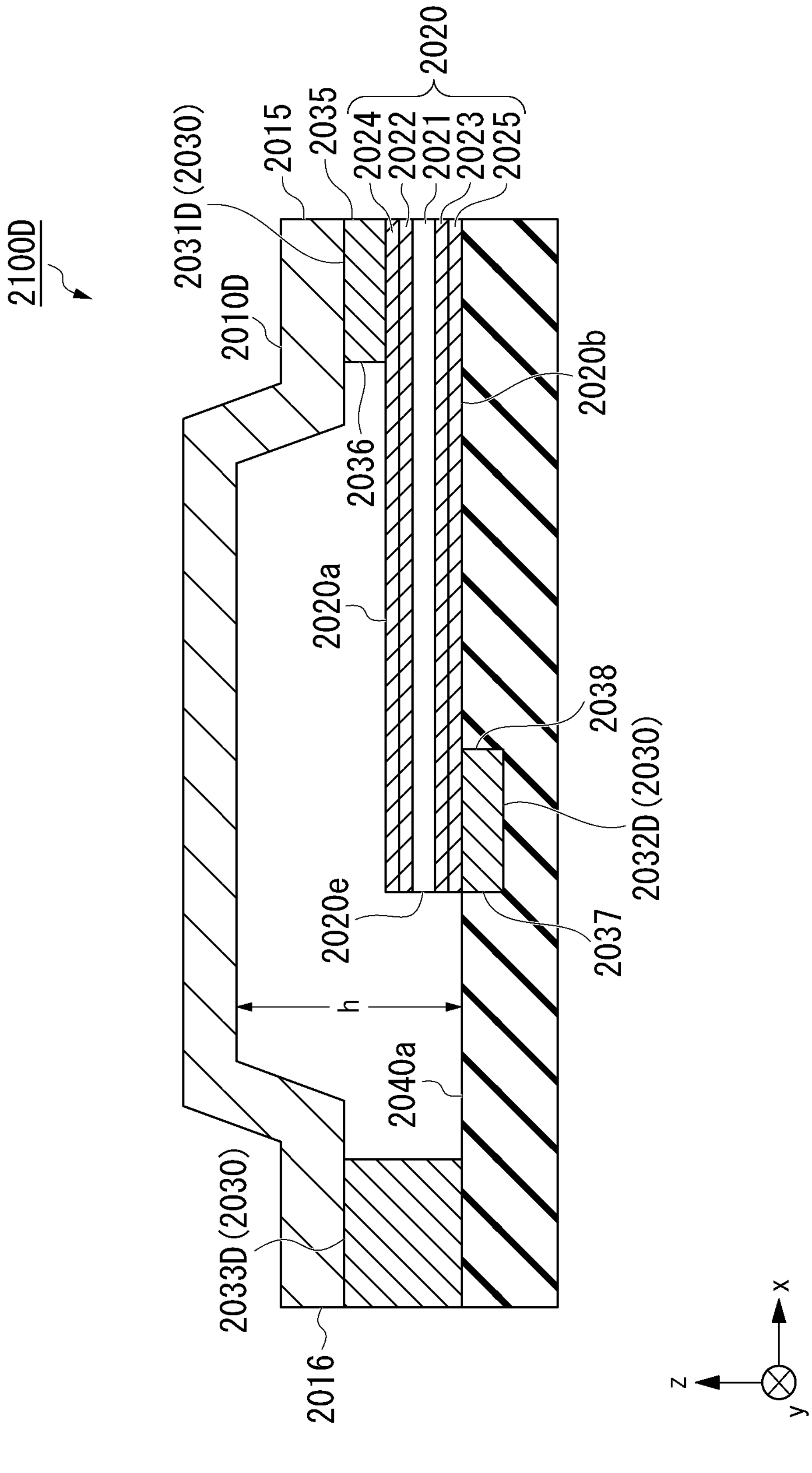
FIG. 14 is a cross-sectional view of a power generator according to a fourth embodiment.

FIG. 14 is a cross-sectional view of a power generator 2100D according to a fourth embodiment. The power generator 2100D according to the fourth embodiment differs from the power generator 2100C according to the modification example 3 of the third embodiment in shape of a deformable body 2010D. In the power generator 2100D, the same reference signs are applied to the same constituents as the power generator 2100C of the modification example 3 of the third embodiment, and description thereof will be omitted.

The power generator 2100D has the deformable body 2010C, the piezoelectric element 2020, the fixing member 2030, and the support body 2040. For example, the deformable body 2010D has a bent cross-sectional shape. For example, it has a polygonal shape.

For example, the deformable body 2010D has a protrusion 2011, a first bottom portion 2012, and a second bottom portion 2013. The first bottom portion 2012 and the second bottom portion 2013 are parts respectively overlapping the first fixing member 2031C and a third fixing member 2032C in a plan view in the thickness direction. It is preferable that the shape of the deformable body 2010C be symmetrical in the x direction.

For example, the protrusion 2011 is positioned between the first bottom portion 2012 and the second bottom portion 2013. The protrusion 2011 protrudes in a direction perpendicular to a surface on which the piezoelectric element 2020 extends. The protrusion 2011 is apart from the piezoelectric element 2020 in the z direction compared to the first bottom portion 2012 and the second bottom portion 2013. It is preferable that the protrusion 2011 have a shape not overlapping the first bottom portion 2012 and the second bottom portion 2013 in a plan view in the z direction.

For example, the protrusion 2011 includes a plurality of apexes A2011 and A2012 exposed in the positive z direction. In addition, the protrusion 2011 has an upper chord portion 2111 and inclined portions 2112 and 2113. For example, the upper chord portion 2111 is a part extending parallel to the piezoelectric element 2020, and it extends in the x direction. For example, the inclined portion 2112 is a member connecting the upper chord portion 2111 and the first bottom portion 2012 to each other and extends in a direction toward the first fixing member 2031C from the apex A2011. For example, the inclined portion 2113 is a member connecting the upper chord portion 2111 and the second bottom portion 2013 to each other and extend in a direction toward the third fixing member 2033C from the apex A2012.

The distance h between the protrusion 2011 and the piezoelectric element 2020 is larger than a distance between outer surfaces of the first bottom portion 2012 and the second bottom portion 2013 exposed in the positive z direction and the piezoelectric element 2020. For example, the distance h between the protrusion 2011 and the piezoelectric element 2020 need only be 2 times to 200 times the distance between the outer surfaces of the first bottom portion 2012 and the second bottom portion 2013 exposed in the positive z direction and the piezoelectric element 2020.

Regarding the deformable body 2010D, for example, it is possible to use an iron-based alloy such as carbon steel or stainless steel; a copper-based alloy such as brass, phosphor bronze, nickel silver, or beryllium copper; a metal such as a titanium alloy or a nickel alloy such as Inconel; a resin such as rubbers, polyacetal, polycarbonate, polyamide, or polyurea; or a resin such fiber reinforced plastic (FRP), glass-fiber reinforced plastic (GFRP), or carbon-fiber reinforced plastic (CFRP) obtained by reinforcing a resin with glass fibers, carbon fibers or the like.

For example, the thickness of the deformable body 2010D is 0.05 mm to 10 mm, preferably 0.1 mm to 4.0 mm, and more preferably 0.25 mm to 2 mm.

It is also possible for the power generator 2100D according to the present embodiment to achieve effects similar to those of the power generator 2100 according to the third embodiment. In addition, in the power generator 2100D, the deformable body 2010D has the protrusion 2011 and has a part having a shape inclined toward the fixing member 2030 from the protruding part. For this reason, when stress is applied to the protrusion 2011, the stress in the positive x direction is likely to be propagated to the piezoelectric element 2020 via the first fixing member 2031C.

This fourth embodiment has illustrated an example in which the inclined portions 2112 and 2113 of the protrusion 2011 linearly extend, but the power generator 2100D is not limited to this example. For example, in the power generator 2100D, each of the inclined portions 2112 and 2113 may have a structure in which a plurality of linearly extending members are combined. That is, the apexes may be included within the inclined portions 2112 and 2113.

In the third embodiment, the fourth embodiment, and the modification examples described above, a constitution in a case of placing a power generator on a flat placement surface has been exemplified in illustration, but it can also be placed on a non-flat placement surface. For example, the power generators according to the foregoing embodiments can also be placed on a curved placement surface or the like. When the power generators according to the foregoing embodiments are placed on a curved surface, at least one of the first bottom portion 2012, the second bottom portion 2013, and the piezoelectric element 2020 of the deformable body 2010 may have a shape along a curved surface, or all of them may have a shape along a curved surface. That is, the first bottom portion 2012, the second bottom portion 2013, and the piezoelectric element 2020 of the deformable body 2010 may have a shape corresponding to the shape of the placement surface. In addition, the fixing member 2030 may also have a shape corresponding to the shape of the placement surface.

Power Generation System

Power generation can be performed using the power generator according to each of the embodiments and the modification examples thereof described above. For example, the power generation system according to the present embodiment includes the power generator according to the foregoing embodiments, and a stress applying mechanism that applies stress to a deformable body of the power generator. The power generation system may include a plurality of power generators which are electrically connected to each other, and stress applying mechanisms as many as the number of the power generators.

For example, the power generation system performs power generation by applying stress to the deformable body included in the power generator using the stress applying mechanism. For example, regarding stress applied to the deformable body from outside, amounts of deformation of the deformable body and the piezoelectric element are controlled within an elastic region. That is, stress applied to the deformable body from outside is smaller than yield points of the deformable body and the piezoelectric element.

In the power generation system according to the present embodiment, since the strength of stress is being controlled, elasticity of the deformable body 2010 can be maintained, and efficient power generation can be repeatedly performed.

Fifth Embodiment

Figure 15:
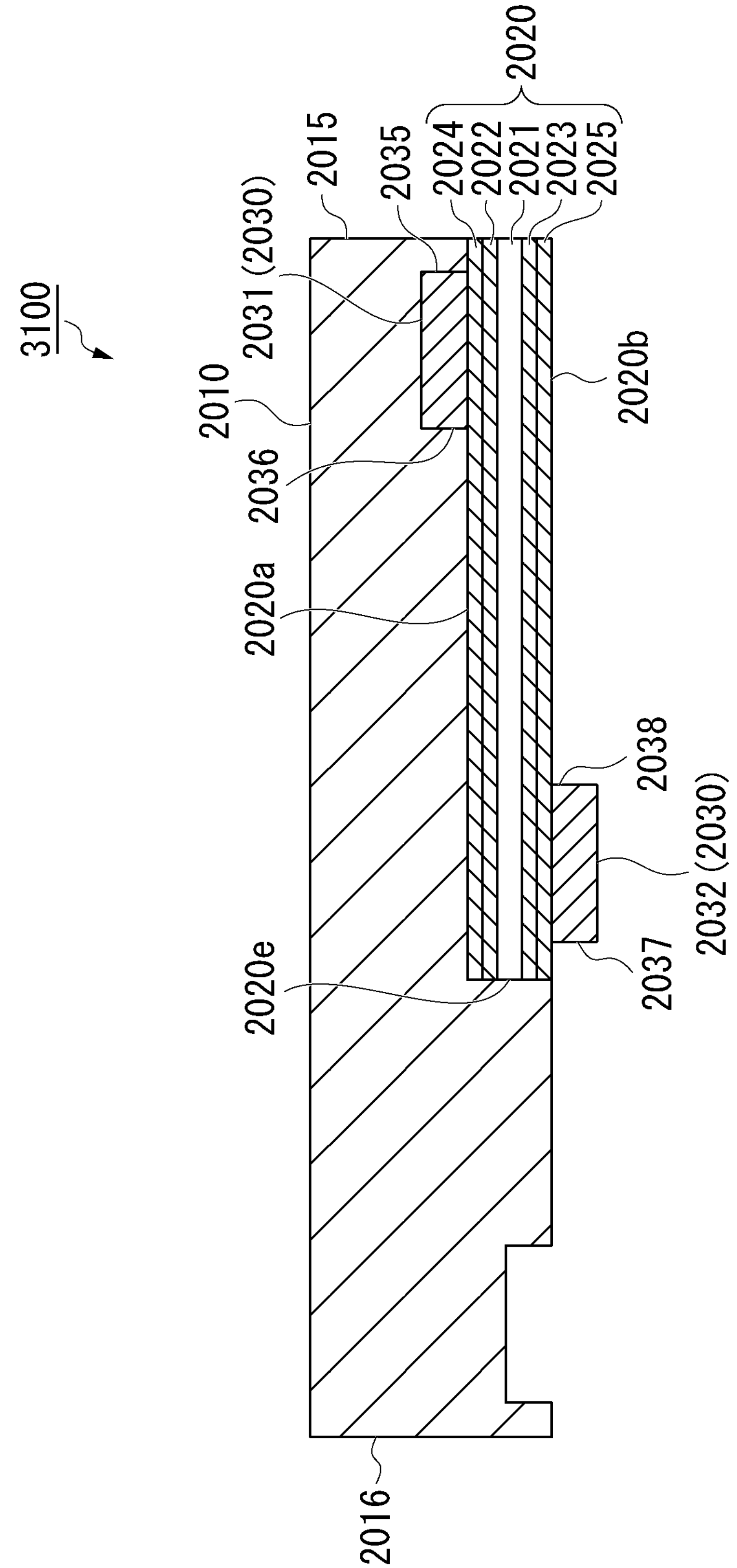
FIG. 15 is a cross-sectional view of a power generator according to a fifth embodiment.
Figure 16:
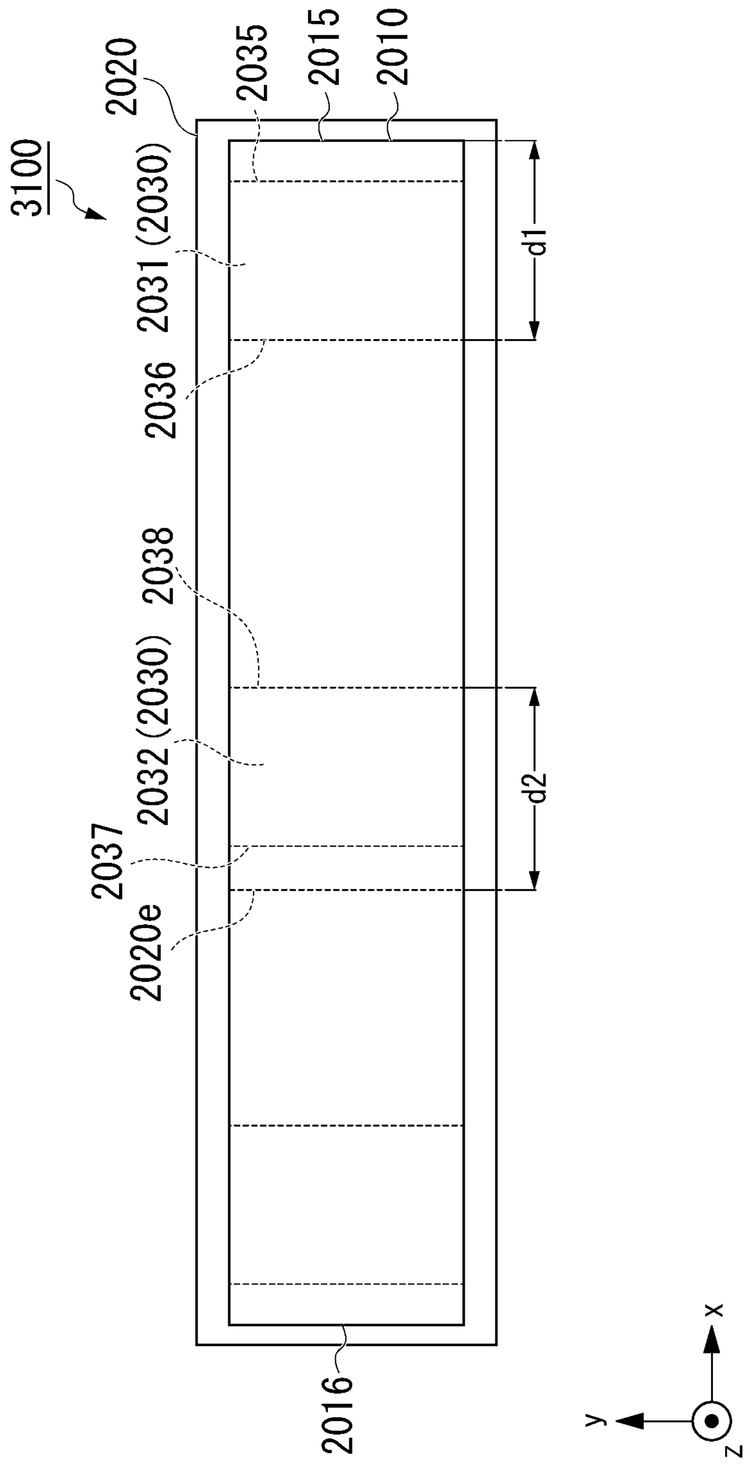
FIG. 16 is a top view of the power generator according to the fifth embodiment.

FIG. 15 is a cross-sectional view of a power generator 3100 according to a fifth embodiment, and FIG. 16 is a top view of the power generator 3100 according to the fifth embodiment.

The difference between the power generator 3100 according to the fifth embodiment and the power generator 2100 according to the third embodiment is that the support body 2040 and the third fixing member 2033 which are provided in the latter power generator are not provided in the former power generator.

Except for the foregoing difference, the constituents and the effects of the power generator 3100 according to the fifth embodiment and the constituents and the effects of the power generator 2100 according to the third embodiment are the same as each other. For this reason, description of common parts between the fifth embodiment and the third embodiment will be omitted. The same reference signs are used for constituent elements corresponding to these embodiments.

In the power generator 3100 according to the present embodiment, as a member which comes into contact with the second main surface 2020*b* of the piezoelectric element 2020 on the first main surface 2040*a* side and supports the piezoelectric element 2020, an external support body which is not included in the power generator 3100, for example, a floor, a wall, or the inside of an electronic component, can be used by being attached thereto.

In the power generator 3100 according to the fifth embodiment, even if a member corresponding to the support body in the third embodiment is not separately provided, the same effects as the third embodiment can be obtained by utilizing an external support body which is not included in the power generator 3100.

In the power generator 3100 according to the present embodiment, a part of the deformable body 2010 (2010A, 2010B. 2010C, or 2010D) may be indirectly fixed to the piezoelectric element 2020 by means of the second fixing member 2032 (2032A, 2032B, 2032C, or 2032D) for fixing the piezoelectric element 2020.

Here, the expression "being indirectly fixed" denotes that the second fixing member 2032 (2032A, 2032B, 2032C, or 2032D) is not directly fixed to the deformable body 2010 but is fixed thereto with another member therebetween.

Examples of another member include an external support body which is not included in the power generator 3100, for example, a floor, a wall, or the inside of an electronic component.

An external support body and the piezoelectric element 2020 may be directly fixed with the second fixing member 2032 (2032A, 2032B, 2032C, or 2032D) therebetween.

In addition, an external support body and the deformable body 2010 may be directly fixed with an external fixing member therebetween.

In the power generator 3100 according to the present embodiment, stress received by the deformable body 2010 from outside is applied to the piezoelectric element 2020 via the first fixing member 2031 and the second fixing member 2032 so that the piezoelectric element 2020 can be significantly deformed in the in-plane direction. Therefore, in the power generator 3100 according to the present embodiment, a large amount of power generation can be obtained.

The power generator 3100 according to the present embodiment can also be utilized as a stress sensor using the amount of obtained power generation as an output.

Modification Example 1 of Fifth Embodiment

Figure 17:
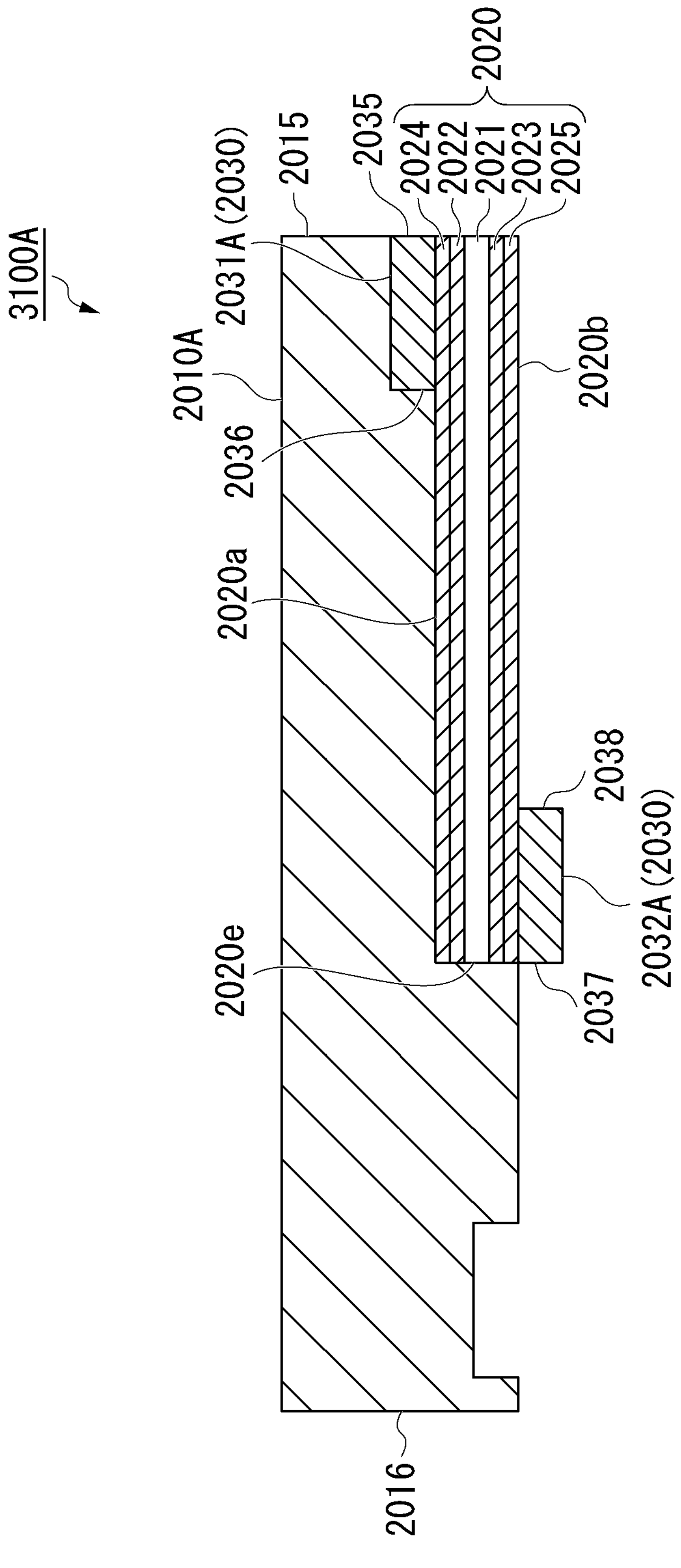
FIG. 17 is a cross-sectional view of a power generator according to a modification example 1 of the fifth embodiment.

FIG. 17 is a cross-sectional view of a power generator 3100A according to a modification example 1 of the fifth embodiment. The power generator 3100A according to the modification example 1 differs from the power generator 3100 according to the fifth embodiment in disposition of the first fixing member 2031A and the second fixing member 2032A with respect to the piezoelectric element 2020. In the modification example 1, the same reference signs are applied to the same constituents as the fifth embodiment, and description thereof will be omitted.

The difference between the power generator 3100A according to the modification example 1 of the fifth embodiment and the power generator 2100A according to the modification example 1 of the third embodiment is that the support body 2040 and the third fixing member 2033 which are provided in the latter power generator are not provided in the former power generator.

Except for the foregoing difference, the constituents and the effects of the power generator 3100A according to the modification example 1 of the fifth embodiment and the constituents and the effects of the power generator 2100A according to the modification example 1 of the third embodiment are the same as each other. For this reason, description of common parts between these modification examples will be omitted. The same reference signs are used for constituent elements corresponding to these embodiments.

Modification Example 2 of Fifth Embodiment

Figure 18:
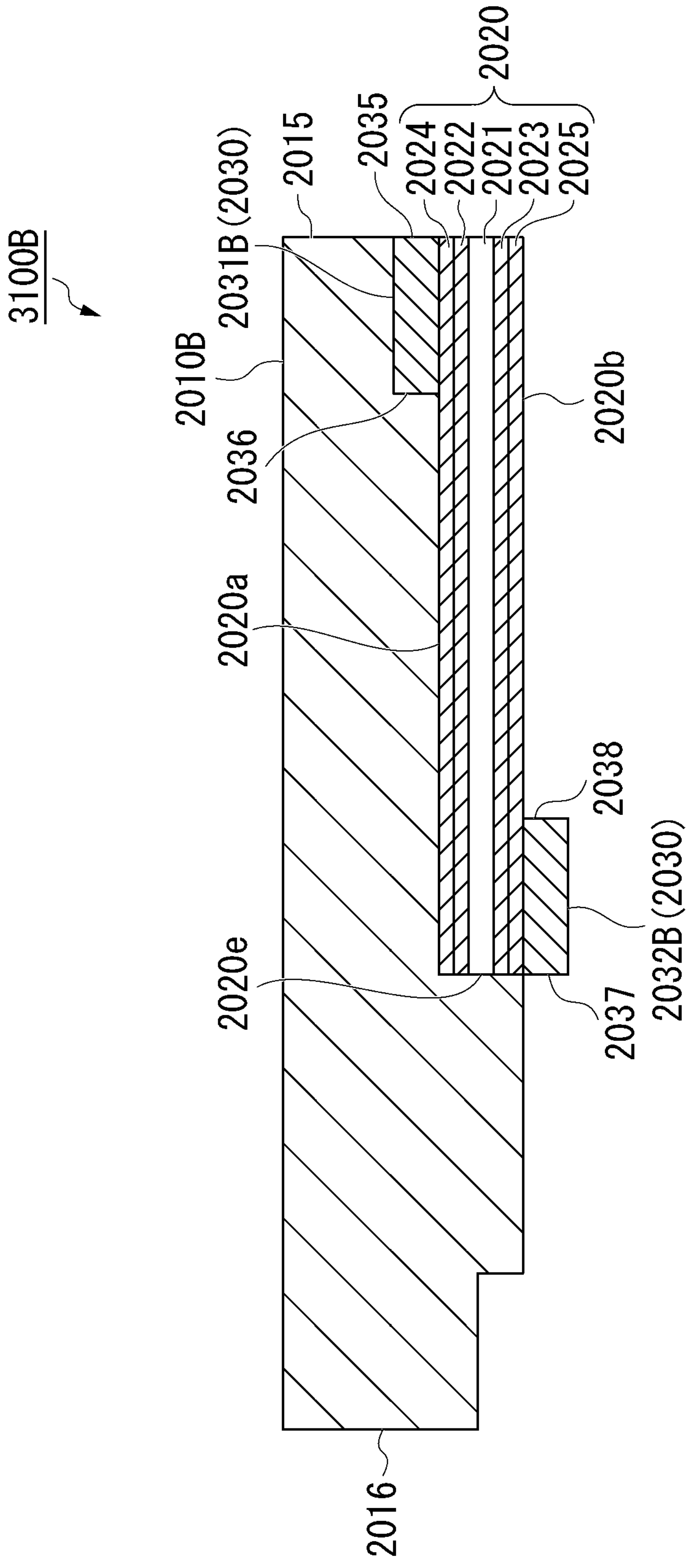
FIG. 18 is a cross-sectional view of a power generator according to a modification example 2 of the fifth embodiment.

FIG. 18 is a cross-sectional view of a power generator 3100B according to a modification example 2 of the fifth embodiment. The power generator 3100B according to the modification example 2 differs from the power generator 3100 according to the fifth embodiment in disposition of the first fixing member 2031A and the second fixing member 2032A with respect to the piezoelectric element 2020. In the modification example 2, the same reference signs are applied to the same constituents as the fifth embodiment, and description thereof will be omitted.

The difference between the power generator 3100B according to the modification example 2 of the fifth embodiment and the power generator 2100B according to the modification example 2 of the third embodiment is that the support body 2040 and the third fixing member 2033 which are provided in the latter power generator are not provided in the former power generator.

Except for the foregoing difference, the constituents and the effects of the power generator 3100B according to the modification example 2 of the fifth embodiment and the constituents and the effects of the power generator 2100A according to the modification example 2 of the third embodiment are the same as each other. For this reason, description of common parts between these modification examples will be omitted. The same reference signs are used for constituent elements corresponding to these embodiments.

Modification Example 3 of Fifth Embodiment

Figure 19:
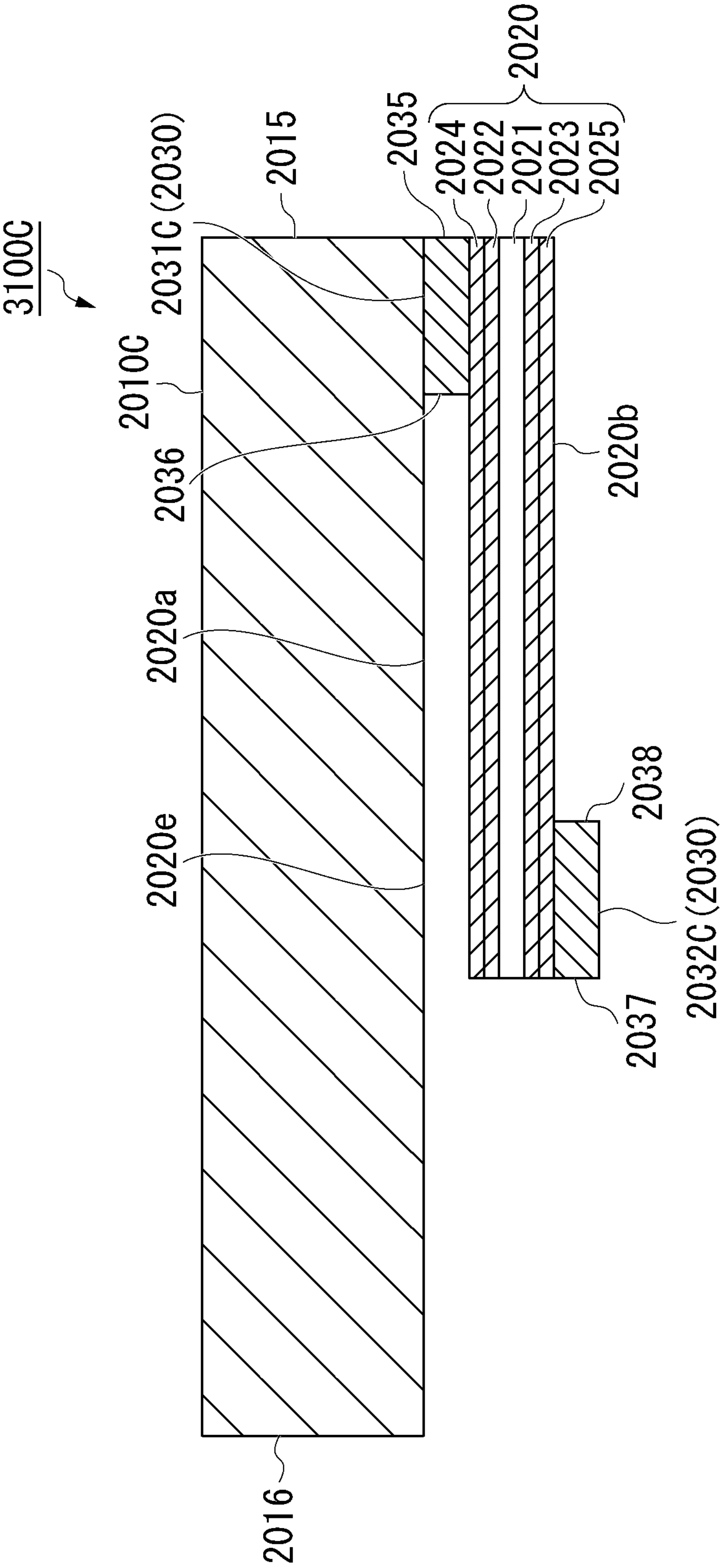
FIG. 19 is a cross-sectional view of a power generator according to a modification example 3 of the fifth embodiment.

FIG. 19 is a cross-sectional view of a power generator 3100C according to a modification example 3 of the fifth embodiment. The power generator 3100C according to the modification example 3 differs from the power generator 3100B according to the modification example 2 of the fifth embodiment in shape of the deformable body 2010C. In the modification example 3, the same reference signs are applied to the same constituents as the fifth embodiment, and description thereof will be omitted.

The difference between the power generator 3100C according to the modification example 3 of the fifth embodiment and the power generator 2100C according to the modification example 3 of the third embodiment is that the support body 2040 and the third fixing member 2033 which are provided in the latter power generator are not provided in the former power generator.

Except for the foregoing difference, the constituents and the effects of the power generator 3100C according to the modification example 3 of the fifth embodiment and the constituents and the effects of the power generator 2100C according to the modification example 3 of the third embodiment are the same as each other. For this reason, description of common parts between these modification examples will be omitted. The same reference signs are used for constituent elements corresponding to these embodiments.

Sixth Embodiment

Figure 20:
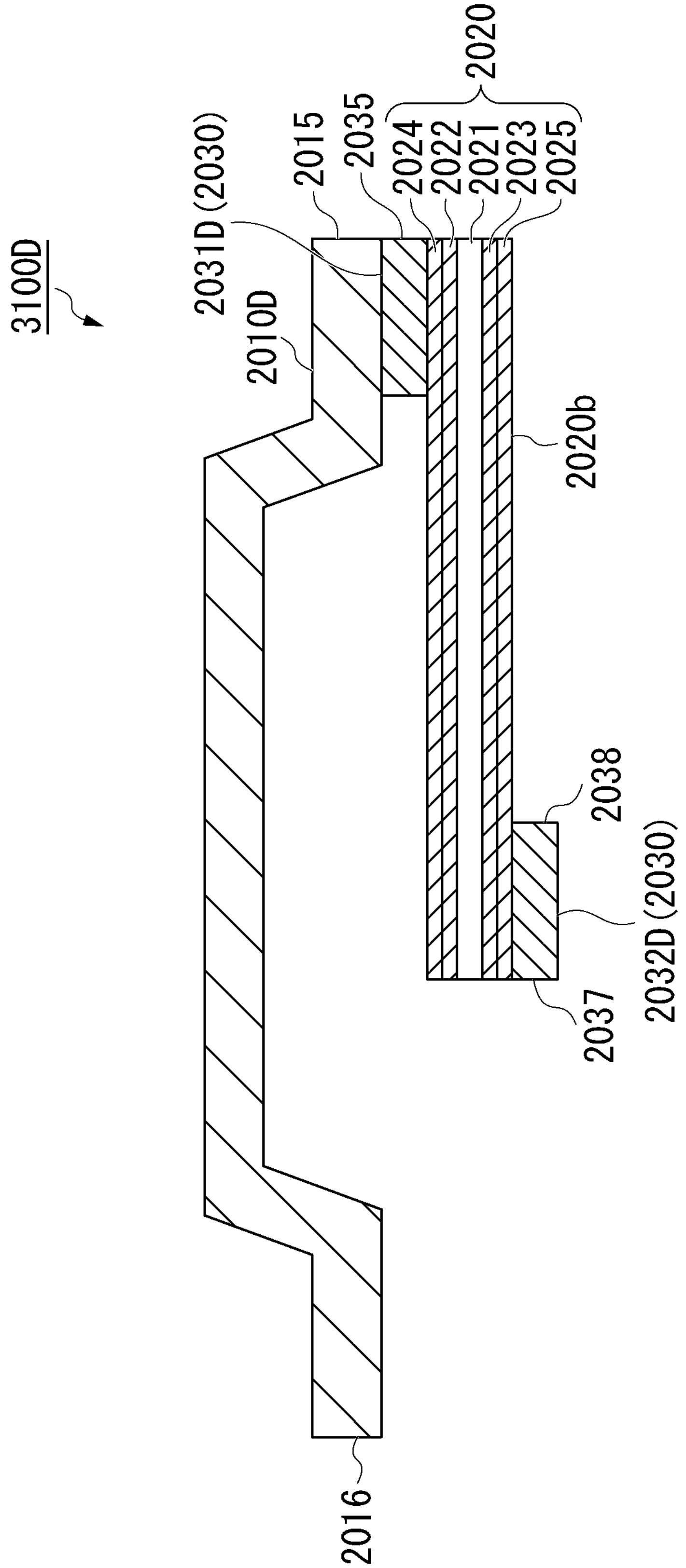
FIG. 20 is a cross-sectional view of a power generator according to a sixth embodiment.

FIG. 20 is a cross-sectional view of a power generator 3100D according to a sixth embodiment. The power generator 3100D according to the sixth embodiment differs from the power generator 3100C according to the modification example 3 of the fifth embodiment in shape of the deformable body 2010D. In the power generator 3100D, the same reference signs are applied to the same constituents as the power generator 3100C of the modification example 3 of the fifth embodiment, and description thereof will be omitted.

The difference between the power generator 3100D according to the sixth embodiment and the power generator 2100D according to the fourth embodiment is that a support body 2040*a* and a third fixing member 2033D which are provided in the latter power generator are not provided in the former power generator.

Except for the foregoing difference, the constituents and the effects of the power generator 3100D according to the sixth embodiment and the constituents and the effects of the power generator 2100D according to the fourth embodiment are the same as each other. For this reason, description of common parts between these modification examples will be omitted. The same reference signs are used for constituent elements corresponding to these embodiments.

A deformation portion 2010D of the power generator 3100D according to the sixth embodiment may include a bent portion constituted of the protrusion 2011, the first bottom portion 2012, and the second bottom portion 2013 as illustrated in FIG. 20.

In addition, the deformation portion 2010D of the power generator 3100D according to the sixth embodiment may include a curved portion which is curved upward as the deformable body 1010E of the power generator 1100E according to the modification example 4 of the first embodiment illustrated in FIG. 7.

Hereinabove, several embodiments have been described. These embodiments have been presented as examples and are not intended to limit the scope of the invention. These embodiments can be performed in various other forms, and various omissions, replacements, and changes can be performed within a range not departing from the gist of the invention. These embodiments and modifications thereof are included in the invention described in the claims and the scope equivalent thereto as they are included in the scope and the gist of the invention.

For example, in the power generators of the present invention, since an electromotive voltage value and a voltage waveform vary depending on stress, they can also be applied as sensors for detecting stress as necessary.

INDUSTRIAL APPLICABILITY

An amount of power generation of a piezoelectric element can be increased.

REFERENCE SIGNS LIST

1010, 1010A to E, 2010, 2010A to D, 3010, 3010A to D Deformable body
1011, 1011D, 2011 Protrusion
1012, 1012E First bottom portion
1013, 1013E Second bottom portion
1015, 2015 First end portion
1016, 2016 Second end portion
1020, 2020 Piezoelectric element
1021, 2021 Piezoelectric film
1022, 2022 First electrode
1023, 2023 Second electrode
1024, 1025, 2024, 2025 Protective layer
1030, 2030 Fixing member
1031, 1031A, 1031E, 2031, 2031A to D First fixing member
1032, 1032A, 1032B, 2032, 2032A to D Second fixing member
2033, 2033B to D Third fixing member
1031Ea, 1032Ea First part
1031Eb, 1032Eb Second part
1035, 1037, 2035, 2037 First end portion
1036, 1038, 2036, 2038 Second end portion
2040 Support member
2040*a* First main surface
2040*b* Second main surface
1100, 1100A to F, 2100, 2100A to D, 3100, 3100A to D. Power generator

The invention claimed is:

1. A power generator comprising:

a piezoelectric element that includes a piezoelectric film, and a first electrode and a second electrode sandwiching the piezoelectric film therebetween;

a deformable body that has Young's modulus larger than synthetic Young's modulus of the piezoelectric element;

a first fixing member that directly fixes the piezoelectric element and the deformable body; and a second fixing member that is disposed apart from the first fixing member and fixes the piezoelectric element, wherein the deformable body is deformed with respect to stress from outside in a direction in which a distance between the first fixing member and the second fixing member is lengthened, wherein a piezoelectric constant of the piezoelectric film in a longitudinal direction is larger than a piezoelectric constant thereof in a lateral direction, and wherein the first fixing member and the second fixing member are disposed apart from each other in the longitudinal direction of the piezoelectric film.

2. The power generator according to claim 1, wherein the second fixing member directly fixes the piezoelectric element and the deformable body, and wherein the deformable body is disposed to overlap the piezoelectric element with the first fixing member and the second fixing member therebetween.

3. The power generator according to claim 2, wherein the first fixing member and the second fixing member come into contact with an end portion of the piezoelectric element in a longitudinal direction.

4. The power generator according to claim 2, wherein the deformable body is disposed apart from the piezoelectric element in a first direction perpendicular to a first surface on which the piezoelectric element extends.

5. The power generator according to claim 2, wherein the deformable body has a protrusion which protrudes in a first direction perpendicular to a first surface on which the piezoelectric element extends.

6. The power generator according to claim 2, wherein the piezoelectric element has a protective layer which overlaps at least one outer surface of the first electrode and the second electrode, and wherein Young's modulus of the protective layer is larger than Young's modulus of the piezoelectric film and smaller than synthetic Young's modulus of the deformable body.

7. The power generator according to claim 2, wherein a protective layer is disposed on a surface of outer surfaces of the piezoelectric element on a side closer to the deformable body, and wherein the protective layer comes into contact with the first fixing member and the second fixing member and has Young's modulus larger than Young's modulus of the piezoelectric film and smaller than synthetic Young's modulus of the deformable body.

8. The power generator according to claim 2, wherein the first fixing member and the second fixing member are adhesives having Young's modulus larger than synthetic Young's modulus of the piezoelectric element.

9. The power generator according to claim 2, wherein the first fixing member and the second fixing member are adhesives having a shearing adhesion strength of 10 MPa or higher.

10. The power generator according to claim 2, wherein the first fixing member and the second fixing member have a first part which is positioned between the piezoelectric element and the deformable body and a second part which overlaps the first part and covers at least a part of the deformable body.

11. A power generation system using the power generator according to claim 2.

12. The power generator according to claim 1, wherein the deformable body is disposed on a first main surface side on which the piezoelectric element extends, wherein the power generator further comprises a support body that is disposed on a second main surface side of the piezoelectric element and supports the piezoelectric element, wherein the first fixing member is disposed on the first main surface side of the piezoelectric element, wherein the second fixing member is disposed on the second main surface side of the piezoelectric element and directly fixes the piezoelectric element and the support body, and wherein the power generator further comprises a third fixing member that directly fixes the deformable body and the support body.

13. The power generator according to claim 1, wherein at least any one of the first fixing member and the second fixing member comes into contact with an end portion of the piezoelectric element in a longitudinal direction.

14. The power generator according to claim 1, wherein a third fixing member is disposed on an outward side of an end portion of the piezoelectric element.

15. The power generator according to claim 1, wherein the deformable body is disposed apart from the piezoelectric element in a thickness direction perpendicular to a first main surface on which the piezoelectric element extends.

16. The power generator according to claim 1, wherein the deformable body has a protrusion which protrudes in a thickness direction perpendicular to a first main surface on which the piezoelectric element extends.

17. The power generator according to claim 1, wherein the piezoelectric element has a protective layer which overlaps at least one outer surface of the first electrode and the second electrode, and wherein Young's modulus of the protective layer is larger than Young's modulus of the piezoelectric film and smaller than synthetic Young's modulus of the deformable body.

18. The power generator according to claim 17, wherein the protective layer comes into contact with at least any one of the first fixing member and the second fixing member.

19. The power generator according to claim 1, wherein the first fixing member and the second fixing member include an adhesive having Young's modulus larger than synthetic Young's modulus of the piezoelectric element.

20. The power generator according to claim 1, wherein the first fixing member and the second fixing member include an adhesive having a shearing adhesion strength of 10 MPa or higher.

21. A power generation system using the power generator according to claim 1, wherein an amount of deformation of the deformable body is within an elastic deformation region of the deformable body and the piezoelectric element.

* * * * *